(12) United States Patent
Brueck et al.

(10) Patent No.: US 11,086,218 B1
(45) Date of Patent: Aug. 10, 2021

(54) METHOD AND APPARATUS FOR FABRICATION OF LARGE AREA 3D PHOTONIC CRYSTALS WITH EMBEDDED WAVEGUIDES

(71) Applicant: UNM RAINFOREST INNOVATIONS, Albuquerque, NM (US)

(72) Inventors: Steven R.J. Brueck, Albuquerque, NM (US); Alexander K. Raub, Danbury, CT (US)

( * ) Notice: Subject to any disclaimer, the term of this patent is extended or adjusted under 35 U.S.C. 154(b) by 304 days.

(21) Appl. No.: 16/047,696

(22) Filed: Jul. 27, 2018

Related U.S. Application Data

(62) Division of application No. 14/844,470, filed on Sep. 3, 2015, now Pat. No. 10,061,194, which is a division of application No. 13/365,964, filed on Feb. 3, 2012, now Pat. No. 9,152,040.

(60) Provisional application No. 61/439,722, filed on Feb. 4, 2011.

(51) Int. Cl.
*G03F 7/20* (2006.01)
*G02B 6/13* (2006.01)
*G03F 7/00* (2006.01)
*G03F 7/40* (2006.01)
*G03F 7/32* (2006.01)
*B82Y 20/00* (2011.01)

(52) U.S. Cl.
CPC ............ *G03F 7/0005* (2013.01); *B82Y 20/00* (2013.01); *G03F 7/2022* (2013.01); *G03F 7/2041* (2013.01); *G03F 7/32* (2013.01); *G03F 7/40* (2013.01); *G02F 2202/32* (2013.01)

(58) Field of Classification Search
CPC .... G03F 7/2022; G03F 7/2041; G03F 7/0005; G02B 6/12002; G02B 6/1225; B82Y 20/00
USPC ........................................................ 430/321
See application file for complete search history.

(56) References Cited

U.S. PATENT DOCUMENTS

| | | | |
|---|---|---|---|
| 6,226,110 B1 | 5/2001 | Murray Clube | |
| 6,233,044 B1 | 5/2001 | Brueck et al. | |
| 6,641,268 B2 | 11/2003 | Bloomstein et al. | |
| 6,882,477 B1 | 4/2005 | Schattenburg et al. | |
| 2006/0099534 A1* | 5/2006 | Murakowski | G02B 6/13 430/322 |
| 2006/0274295 A1 | 12/2006 | Brueck et al. | |

OTHER PUBLICATIONS

Lai et al., "Fabrication of two- and three-dimensional periodic structures by multi-exposure of two-beam interference technique," Optics Express, vol. 13, No. 23, Nov. 2005, pp. 9605-9611.
Liu et al., "Fabrication of three-dimensional photonic crystals with two-beam holographic lithography," Applied Optics, vol. 45, No. 3, Jan. 2006, pp. 480-483.
Gauthier et al., "Designed of photonic band gap structures through a dual-beam multiple exposure technique," Optics & Laser Technology, 36, Jan. 2004, pp. 625-633.

\* cited by examiner

*Primary Examiner* — John A McPherson
(74) *Attorney, Agent, or Firm* — MH2 Technology Law Group LLP

(57) ABSTRACT

In accordance with some aspects of the present disclosure, a maskless interferometric lithography system for fabricating a three-dimensional (3D) photonic crystal using a multiple two-beam-exposures is disclosed. The system can comprise an illumination system comprising an optical arrangement operable to receive radiation from a radiation source and provide three or more tilted two-beam interference pattern exposures to be combined into a three-dimensional pattern; and a substrate operable to be supported by a substrate table, wherein the substrate comprises a photoresist formed on a top surface of the substrate and operable to receive the three-dimensional pattern and wherein means are provided to adjust the position of the substrate in all six mechanical degrees of freedom.

17 Claims, 25 Drawing Sheets a: First exposure
b: Rotate 60°, Second exposure
c: Rotate additional 60° (120° total), Third exposure

*Light Gray: Photoresist Surface*
*Dark Gray: Photoresist Cross-section at Boundary*

— Parameter space for traditional holographic PC (line)
▨ Parameter space for off axis 3D IL PC 3 Exposure IL Hexagonal Photonic Crystals 3 Exposure IL Hexagonal Photonic Crystals 4 Exposure IL Cubic Photonic Crystals 4 Exposure IL Cubic Photonic Crystals a: First exposure
b: Rotate 60°, Second exposure
c: Rotate additional 60° (120° total), Third exposure
d: Rotate additional 60° (180° total), Fourth exposure
e: Rotate additional 60° (240° total), Fifth exposure
f: Rotate additional 60° (300° total), Sixth exposure

*Light Gray: Photoresist Surface*
*Dark Gray: Photoresist Cross-section at Boundary*

6 Exposure IL Helical Photonic Crystals

6 Exposure IL Helical Photonic Crystals

METHOD AND APPARATUS FOR FABRICATION OF LARGE AREA 3D PHOTONIC CRYSTALS WITH EMBEDDED WAVEGUIDES

CROSS REFERENCE TO RELATED APPLICATIONS

This application is a divisional of U.S. patent application Ser. No. 14/844,470 filed on Sep. 3, 2015, which is a divisional of U.S. patent application Ser. No. 13/365,964 filed on Feb. 3, 2012, now U.S. Pat. No. 9,152,040 issued Oct. 6, 2015, which claims priority to U.S. Provisional Patent Application No. 61/439,722 filed on Feb. 4, 2011, both of which are hereby incorporated in their entireties by reference.

GOVERNMENT INTEREST

This invention was made with U. S. Government support under Contract No. FA9550-09-100202 awarded by the Air Force Office of Scientific Research. As a result the U. S. Government has certain rights in this invention.

FIELD OF THE INVENTION

This invention relates generally to photonic crystals and, more particularly, to materials and methods of large area three-dimensional (3D) photonic crystals and to waveguides embedded within the 3D photonic crystals.

BACKGROUND OF THE INVENTION

A three-dimensional (3D) crystal has a periodic dielectric function in all three orthogonal Cartesian directions (x, y, z-axes). 3D photonic crystals are attractive for very compact waveguide devices. There are numerous ways to fabricate 3D photonic crystals (PhCs) including ion-beam milling, multi-step lithography and etching (woodpile approach), and 4 or 5-beam holography. The ion-milling and woodpile approaches are process intensive and have alignment or inter-level registration issues. Single-exposure, multi-beam holography has the advantage of being able to form PhCs in a single lithography step, but has limitations on the PhC shape and size, including interrelationships between the various periodicities that restrict the available parameter space.

Interferometric lithography (IL) is a well established technique for producing 2D, e. g. confined to a photoresist layer on a substrate with variations in the plane of the substrate but not perpendicular to the substrate plane, gratings down to a $\lambda/4n$ half-pitch where $\lambda$ is the exposure wavelength and n the refractive index of any immersion medium (n=1 for air). IL has a large depth-of-focus with inherent uniformity for forming large-area gratings on photoresist-coated wafers. Using IL, there is no need to use a mask or lens system to produce small pitch structures. This creates an inexpensive, large-area fabrication capability for sub-micrometer pitch periodic features.

An issue in conventional multi-beam (typically 4 or 5 beams) approaches to 3D IL is that the z-pitch is constrained by the physics of the optical configuration and is typically much larger than the (x-, y-) pitches, for cases where the exposure wavelength is much shorter than the PhC pitch. This is the usual case where the exposure wavelength is in the ultraviolet region of the spectrum while the PhC is designed for visible or infrared wavelengths. Note that throughout this disclosure the pitches will be referred to as the orthogonal (x-, y- and z-) directions notwithstanding the fact that different symmetry photonic crystals have different unit cells which may not align with these Cartesian directions.

Additionally, in conventional single exposure IL, the pitch in all three directions is a function of each of the plane-wave beam angles and the exposure wavelength. In order to obtain a photonic crystal (PhC) with the x, y, and z pitches similar to each other, the exposure beam angle θ must be as close as possible to 90°, and the exposure wavelength must be close to the desired pattern pitch dimension. For example, if the desired PhC pitch is 750 nm then the exposure wavelength needs to be ~750 nm. This is difficult because it requires a photoresist that is sensitive at that wavelength, and if the desired pitch is changed then the photoresist and the laser source also need to be changed. Most available photoresists are designed for ultraviolet and deep-ultraviolet light, rather than for infrared light. Some applications, for example to telecommunications systems, require periodicities corresponding to infrared wavelengths, where commercial photoresists are typically not available.

Photonic crystals have many useful properties and more applications are available by combining PhCs with integrated optical waveguides. Waveguides in PhCs can guide light around sharp bends, filter light, spit or mix light into multiple waveguides, and provide optical isolators and optically coupled cavities. As a result of the confinement over long path lengths, as compared with bulk material propagation, waveguides embedded in a PhC can also exhibit non-linear optical properties that can be used for optical computing applications. Most techniques for embedding waveguides into PhC involve either forming the defects or waveguide when fabricating the PhC in a layer-by-layer fashion, or by a direct write, two-photon method used for typical holographically produced PhCs. In all cases the embedded waveguide formation is a tedious and slow process.

Chiral, coil-spring-like helical photonic crystal structures, are useful for optical applications including: circular polarizers, optical diodes, and optical isolators. A chiral material lacks any planes of mirror symmetry, and is characterized by a cross coupling between the electric and the magnetic material response. This results in breaking the degeneracy between the two circularly polarized waves; i.e., the refractive index is increased for one circular polarization and reduced for the other. This gives rise to interesting phenomena that are not available from conventional materials including the possibility of a negative refractive index for one circular polarization while the refractive index for the other circular polarization remains positive.

Traditionally helical structures have been formed using either glancing angle deposition (GLAD), a technique based on physical vapor deposition that employs oblique angle deposition conditions, or serial direct laser writing based on multi-photon absorption. Both of these techniques are slow and unsuitable for fabricating helical structures over large areas.

SUMMARY

In accordance with aspects of the present disclosure, a maskless interferometric lithography system for fabricating a three-dimensional (3D) photonic crystal using multiple, two-beam exposures is disclosed. The system can comprise an illumination system including an optical arrangement operable to receive radiation from a radiation source, characterized by both a longitudinal and a transverse coherence and provide two beams at the substrate with overlapping regions of the two beams within the longitudinal and transverse coherence lengths wherein the angle between the wave vectors of each beam and the normal to the substrate surface can be independently adjusted over two subsets of the range from −90° to +90°; and a substrate operable to be supported by a substrate table, wherein the substrate comprises a photoresist formed on a top surface of the substrate and operable to receive the three-dimensional pattern. The degrees of adjustment of the substrate table can include all six rigid body degrees of freedom. Additional layers, such as an antireflection layer may be interspersed between the substrate and the photoresist; additionally, the substrate itself may consist of a layered material structure.

In some aspects, the system can further comprise one or more actuators operable to move the substrate, the substrate table, or both the substrate and the substrate table in one or more degrees of freedom with respect to the illumination system. In some aspects, the one or more degrees of freedom can comprise rotation of the substrate, the substrate table, or both the substrate and the substrate table in a direction azimuthal to an optical axis of the illumination system. In some aspects, the one or more degrees of freedom can comprise a rotation about the z-axis (normal to the substrate), tilts about both x- and y-axes, or both a rotation and two tilts of the substrate table.

In some aspects, the illumination and substrate systems can be operable to provide a multiplicity of two-beam exposures, each two-beam exposure consisting of the intensity interference between two approximately plane wave coherent optical beams incident at two angles from the normal to the substrate wherein the tilt of the interference planes in the photoresist corresponds to the average of the two incident angles in the photoresist. Each of these two-beam exposures is further characterized by an azimuthal angle which is varied between exposures. In various instantiations, the multiplicity is either three, four, or six and the azimuthal angles are either 120°, 90°, or 60° from each other. In addition to controlling the angles of incidence and azimuth, in some instantiations the phase of the interference pattern relative to previous exposures, or to a reference grid on the substrate, is also controlled within the illumination and substrate systems.

In some aspects, the system can further comprise an immersion system arranged to provide an immersion fluid to a portion of the substrate table, the substrate, or both the substrate table and the substrate. In some aspects, the immersion fluid can be provided by an inlet of the immersion system to at least optically homogeneously fill the space between the last optical element of the optical system and the top of the photoresist layer over the area to be exposed atop the substrate during at least one of the exposures by the optical system. In some aspects, the immersion system can comprise a flow control system to control the flow of the immersion fluid provided by the inlet.

The interference pattern in the photoresist has the highest visibility, defined as the difference between intensity maxima and minima divided by the sum of the intensity maxima and minima, $[(I_{max}-I_{min})/(I_{max}+I_{min})]$, when the electric field amplitudes of the two beams in the photoresist are equal, and all parts of the overlapping beams are positioned within the longitudinal and transverse coherence lengths of the source. The highest visibility in the exposure pattern results in the highest contrast latent image fringes following the exposure and the most well-defined structures on developing the photoresist. Accordingly, in some aspects various optical elements are introduced in the system to control the beams to arrange these conditions.

In some aspects, the system can further comprise one or more optical compensators operable to control and/or compensate for path length differences of the two-beams in the illumination system, to within the longitudinal and transverse coherence lengths of the laser source. In some aspects, the one or more optical compensators can comprise one or more actuators coupled to one or more optical elements of the illumination system operable to adjust a path length of one or more radiation beams directed onto the one or more optical elements. This is to arrange the beams so that they are within a longitudinal coherence length of the source.

In some aspects, the system can further comprise one or more astigmatic telescopic systems in one or both legs of the illumination system interferometer to adjust the beam sizes at the substrate plane such that the interfering regions of the two beams are within the transverse coherence length of the source.

In some aspects, the system can further include an optical system to adjust intensity ratios of the radiation such that each transmitted beams of radiation into the photoresist have substantially common electric field amplitudes and therefore a visibility approaching unity.

In some aspects, this optical system can comprise a Fresnel reflection window operable to continuously adjust relative powers of the two coherent radiation beams by rotating the window relative to a propagation direction of the radiation to adjust a ratio of reflected and transmitted power through the Fresnel reflection widow.

In some aspects, control systems can be provided operable to adjust the optical systems included to control the path lengths of the arms of the exposure system, the transverse sizes and relative alignments of the arms of the interferometer beams at the substrate, and the intensities of the arms of the interferometer beams in the photoresist to optimize the visibility of the fringe pattern in the photoresist.

In some aspects, the system can comprise a control system coupled to the one or more actuators and operable to monitor an interference pattern produced by the optical system and by an auxiliary interferometric monitor system to provide one or more signals to the one or more actuators to optimize the relationships between the multiple interference patterns projected onto the substrate by directing the one or more actuators to move the substrate table in one or more degrees of freedom.

In some aspects, the average of the incident angles in at least one of the two-beam exposure provided by the illumination system can be arranged to be off-axis relative to the substrate normal.

In some aspects, the 3D PhC can have hexagonal symmetry.

In some aspects, the 3D PhC can have rectangular symmetry.

In some aspects, the 3D PhC can have helical [chiral] symmetry.

In some aspects, the 3D PhC can have trigonal symmetry.

In some aspects, the 3D PhC can have orthorhombic symmetry.

In some aspects, the 3D PhC can have monoclinic symmetry.

In some aspects, the system can further comprise an alignment system operable to align the substrate, the substrate table, or both the substrate and the substrate table with one or more alignment or registration marks in one or more degrees of freedom.

In some aspects, the system can further comprise a substrate holder operable to secure the substrate onto the substrate table.

In some aspects of the present disclosure, a method of fabricating a three-dimensional (3D) photonic crystal comprising using a multiple-exposure, two-beam interferometric lithography (IL) arrangement is disclosed. The multiple-exposure method can comprise tilting, with the centerline between the two beams tilted relative to the surface normal, and azimuthally rotating the various exposures from each other. The method can comprise generating a shortened z-pitch than that available from a single multi-beam exposure. The method can further comprise incorporating immersion fluids in the interferometric lithography arrangement to further increase the available range of (x-, y-, z-) pitches.

In some aspects of the present disclosure, a method of fabricating a waveguide integrated with a photonic crystal (PhC) comprising using a first wavelength exposure to define a waveguide in a photoresist layer and using a second wavelength exposure to define a PhC in the photoresist, and a photoresist development step to instantiate both the waveguide and the PhC is disclosed. In some aspects, the second wavelength exposure to define a PhC comprises a series of two-beam IL exposures.

In some aspects of the present disclosure, a method of fabricating a waveguide integrated with a photonic crystal (PhC) is disclosed. The method can comprise providing a first photoresist layer on a substrate; defining a waveguide region by exposing a surface of the first photoresist layer using a first wavelength, wherein an absorption depth and exposure dose of the first wavelength is used to set the thickness of the waveguide; forming a second photoresist layer on the first photoresist layer containing the defined waveguide; and defining a photonic crystal throughout the bulk of the photoresist by exposing the two layers of photoresist at a second wavelength, wherein the photoresist is substantially transparent at the second wavelength. Further, this aspect includes development of the photoresist after all of the exposures have been completed.

In some aspects, the PhC can be formed using traditional lithography stepper or scanner using multiple exposures with a phase shift mask and off-axis illumination.

In some aspects of the present disclosure, a method of modifying the developed photoresist structures to enhance the contrast between the refractive indices of the two materials by using sol-gel infiltration, pyrolysis, deposition and plating of metals and dielectrics is disclosed.

DESCRIPTION OF THE EMBODIMENTS

Figure 1:
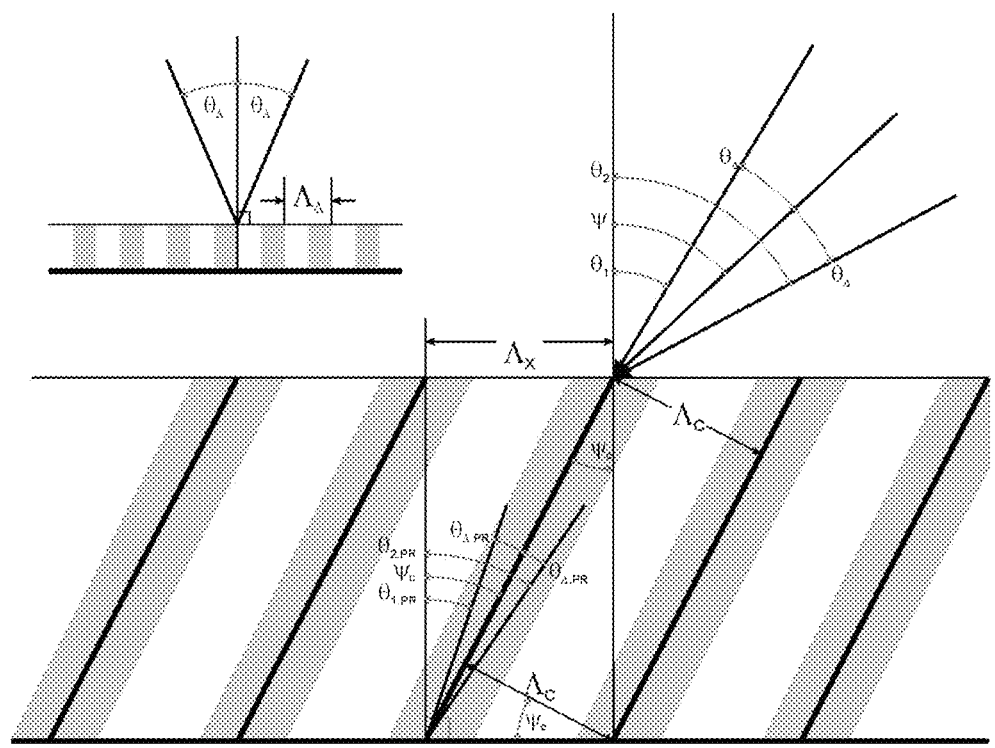
FIG. 1 shows an example multiple-exposure IL approach in accordance with aspects of the present disclosure.

Reference will now be made in detail to the exemplary embodiments of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

The 3D photonic crystals can be formed by a multiple exposure two-beam interferometric lithography technique, which allows for independent dimensional control of the period along each axis of the crystal. For example, each individual crystal lattice constant can be adjusted over a wide range (within the optics constraint that each lattice constant is larger than $\lambda/2n_r$ where $\lambda$ is the source wavelength and $n_r$ the refractive index of the photoresist), greatly increasing the available parameter space and allowing the use of UV lasers and photoresists leveraging off of conventional lithographic capabilities for PhCs scaled to visible and near-infrared wavelengths. The disclosed lithography process can be performed with significantly relaxed constraints on the size, shape and periodicities and having independent control over each periodic pitch of the formed 3D PhCs. Specifically, a two-beam interferometric lithography setup and multiple exposures followed by a single development step can be used to form 3D PhCs. In contrast, prior-art multiple-beam single-exposure interferometric lithography techniques using 3, 4, 5 or more beams have inherent constraints between the lattice constants and the exposure wavelength.

Further, in an interferometric lithographic system there is no mask defining the pattern, but rather a radiation beam is split into two beams, and the two beams are caused to interfere at a target portion of substrate through the use of a reflection system. The interference causes lines to be formed on at the target portion of the substrate. For positive tone resists the lines correspond to the intensity minima of the interferometric standing wave pattern; for negative tone resists the lines correspond to the intensity maxima of the interferometric standing wave pattern.

The term "illumination system" used herein should be broadly interpreted as encompassing any type of illumination system, including refractive, reflective, magnetic, electromagnetic and electrostatic optical systems, or any combination thereof, as appropriate for the exposure radiation being used, or for other factors such as the use of an immersion liquid or the use of a vacuum.

Various embodiments provide materials and methods of fabricating three-dimensional (3D) photonic crystals (PhCs) with or without waveguides embedded in the 3D photonic crystals. Various embodiments also include photonic crystals with integrated waveguides. The waveguides can be embedded inside the 3D photonic crystals by using multiple exposure wavelengths, with one set of exposures at a wavelength that propagates throughout the photoresist for the PhC fabrication and a second at a wavelength that may be highly absorbed in the photoresist for the waveguide fabrication. Such processes can be scalable to manufacturing using standard semiconductor lithography equipment.

A mathematical model of the 3D PhCs and/or the waveguides formed within the PhCs can also be used to facilitate the formation of the exemplary 3D PhCs, to compare with or measure the experimentally produced PhCs.

In the 3D exposure model of the exemplary 3D multiple, two-beam exposure IL, the intensity for all exposures is normalized to 1/N for simulations where N is the number of two beam exposures. This assumes that each exposure has the same exposure dose. This convention is adopted for convenience and is not a necessary restriction; for some applications unequal intensities may be of advantage. Using a simple threshold model for the photoresist development, the expected 3D structures can be calculated. This model is a simplification of the actual photoresist development; nonetheless it provides a good approximation and is very computationally efficient allowing rapid investigation of a large number of exposure sequences and parameters. More accurate photoresist exposure and development models are known in the art and can be used for refined structure prediction and evaluation.

An exemplary advantage of the disclosed multiple, two-beam interferometric lithography exposure approach can include a much greater flexibility to independently control the periodicities of the resulting 3D structures along each axis as compared with prior-art multiple-beam single-exposure approaches. The x-pitch and y-pitch of the pattern in the exposure plane can be controlled by the angle between the two exposure beams $2\theta_\Delta$. The z-pitch of the pattern, perpendicular to the exposure plane, can be controlled by the angle of the intercept between the two beams to the normal of the exposure plane $\psi$, see FIG. 6. In embodiments, the z-pitch can be obtained similar to or the same as the x- and y-pitch.

If both exposure beams are tilted off normal to the exposure plane ($\psi \neq 0$) the interference pattern in the photoresist is also tilted. As a result the different indices of refraction of the incident medium and the photoresist, the incident plane waves of light are bent at the photoresist interface, see FIG. 6. For a vertical interference pattern ($\psi=0$) $\theta_1=-\theta_2$, if both $\theta_1$ & $\theta_2$ are offset by a fixed angle there can be a shift in the interference pattern angle $\psi_c$. The following formulas give the relations between the plane-wave beam angles in the air and in the photoresist as well as some of the defined pitches (periods), refer for FIGS. 1 and 2. Angles to the left side of normal have positive values, and angles to the right side of normal have negative values.

$$\theta_{1,PR} = a\sin\left[\frac{\sin(\theta_1)}{n_r}\right]$$

$$\theta_{2,PR} = a\sin\left[\frac{\sin(\theta_2)}{n_r}\right]$$

$$\psi = \frac{\theta_1 + \theta_2}{2}$$

$$\theta_\Delta = \frac{\theta_2 - \theta_1}{2}\psi_c = \frac{\theta_{1,PR} + \theta_{2,PR}}{2}\theta_{\Delta,PR} = \frac{\theta_{2,PR} - \theta_{1,PR}}{2}$$

$$\Lambda_X = \Lambda_{X,air} = \Lambda_{X,PR} = \frac{\lambda}{\sin(\theta_2) - \sin(\theta_1)} = \frac{\lambda}{n_r \cdot [\sin(\theta_{2,PR}) - \sin(\theta_{1,PR})]}$$

$$\Lambda_c = \Lambda_X \cdot \cos(\psi_c) = \frac{\lambda}{2 \cdot n_r \cdot \sin(\theta_{\Delta,PR})}$$

$$\Lambda_Z = \frac{\Lambda_X}{\tan(\psi_c)}$$

Figure 2:
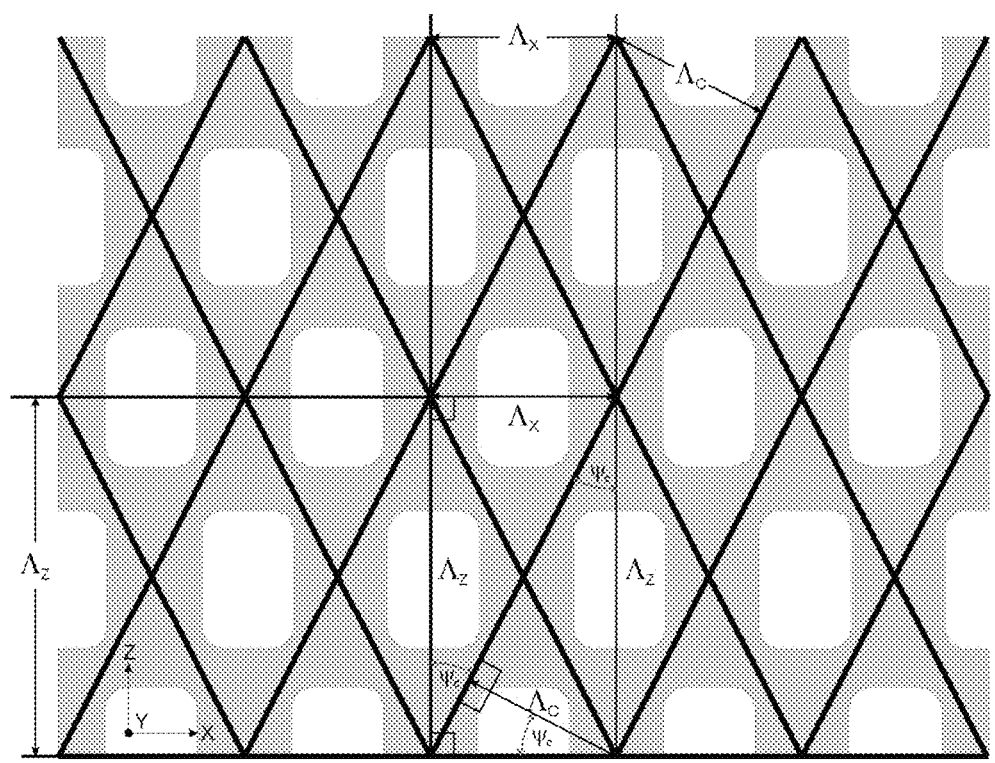
FIG. 2 shows an example multiple-exposure IL approach in accordance with aspects of the present disclosure.

If three or more of these tilted interference pattern exposures are combined a three-dimensional pattern that has a shortened z-pitch, compared with that available for a single, multiple-beam exposure, can be generated. FIGS. 1 and 2 show slice views of a possible 3D PhC structure. As shown, if $\psi_c$=45°, then $\Lambda_x=\Lambda_z$. This can be used to form symmetrical 3D PhCs.

Figure 3:
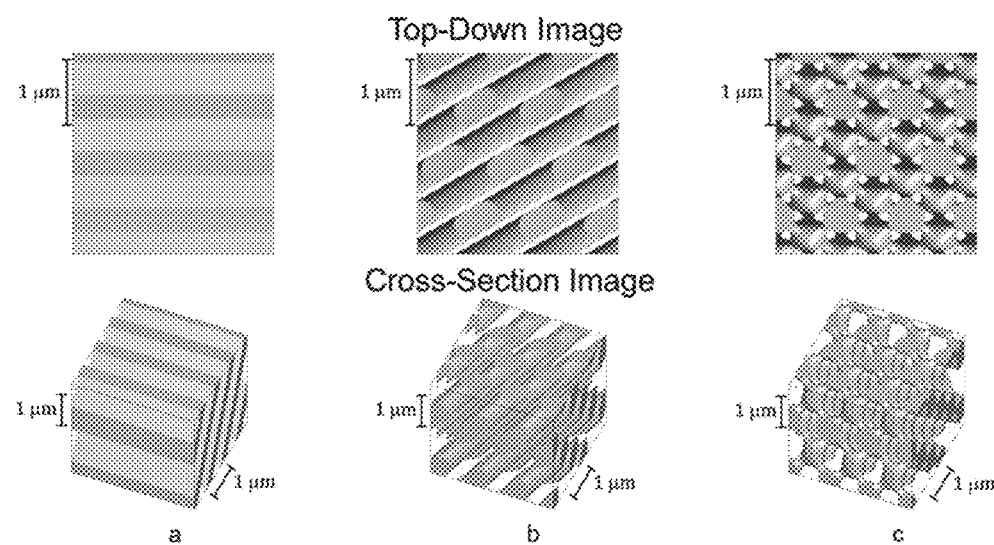
FIG. 3 shows exemplary steps for a three-exposure 3D hexagonal IL PhC.

FIG. 3 shows exemplary steps for a three exposure, two-beam IL 3D PhC. As shown, the first exposure results in a latent image, e.g. a pattern of chemical bond modifications that will result in variations in the local dissolution rate of the resist in a developer after appropriate steps including post-exposure baking, of a one-dimensional grating with tilted lines in the photoresist coating on a substrate. In embodiments, additional thin-film layers such as anti-reflection layers, as known in the art, can be incorporated either above or below the photoresist layer. After 120° rotation of the photoresist-coated sample, the second exposure produces a second latent image tilted at the same angle to the surface normal but rotated 120° azimuthally from the lines of the first latent image. After an additional and final 120° rotation of the sample the third and final exposure can sum with the first two exposures to from a latent image of 3D PhC in the photoresist. The photoresist can then be baked and developed to form the 3D PhC. During the formation process, the rotation and tilt of the wafer between exposures can be controlled.

In embodiments if the rotation or tilt is not set precisely as discussed above, a phase variation along the crystal planes will be generated. This is not present in a single two-beam IL exposure, but rather results from the overlay between all three or more patterns. This will cause a moiré effect on the PhC, that is, the phase of the PhC will vary periodically across the wafer. A laser interferometer or other device with similar function can be used to monitor and provide feedback control of tilt, rotation, and phase between exposures.

Figure 4:
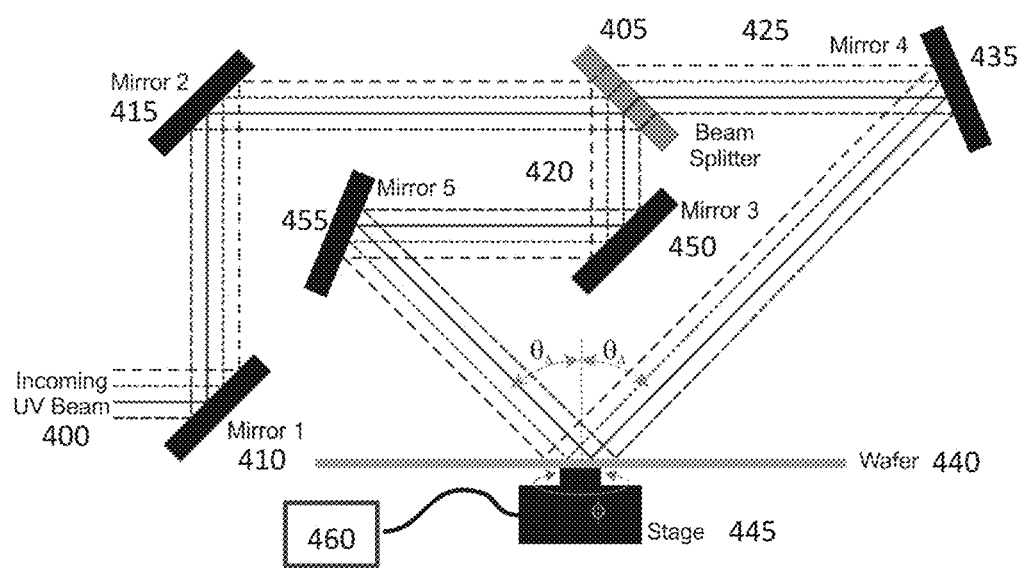
FIG. 4 shows an example illumination system comprising a Michelson interferometer that can be used to provide the interfering beams for the two-beam exposures in accordance with aspects of the present disclosure.

FIG. 4 shows an example illumination system comprising an interferometer, such as a Michelson interferometer, that can be used to provide the interfering beams for the two-beam exposures. The Michelson interferometer can use beamsplitter 405, such as a 50/50 beam splitter, to split an input beam 400, such as an UV beam, from one radiation source (not shown) and directed by optical element 410 and optical element 415, such as a mirror 1 and mirror 2, into two beams 420 and 425, which can have equal intensity. The split two beams can include, e.g., reflected beam 420 and transmitted beam 425. Transmitted beam 425 can be directed to a photoresist (not shown) provided on a top surface of a sample (not shown) via optical element 435, such as mirror 4, at an angle of about $\theta_A$ from a normal of the sample. The sample can be arranged on a substrate (wafer) 440, which can be supported by a substrate table (stage) 445. Reflected beam 420 can be directed to the photoresist to be combined with the transmitted beam 425 via optical element 450, such as mirror 3, and optical element 455, such as mirror 5, at an angle of about $\theta_A$ from the normal of the sample. The optical elements of the illumination system can be arranged with respective mounts (not shown) that can be actuated. Controller 460 can be operable to actuate substrate table 445 in one or more degrees of freedom. For example, controller 460 can be operable to rotate the stage or wafer in direction about an axis perpendicular or substantially perpendicular to a top surface of the wafer or stage. By way of another example, controller 460 can be operable to tilt the stage or wafer in one or more degrees of freedom. The beams in FIG. 4 are arranged symmetrically about the normal to the substrate. As a consequence, the interference fringes in the photoresist are normal to the substrate as in the inset to FIG. 1.

Figure 5:
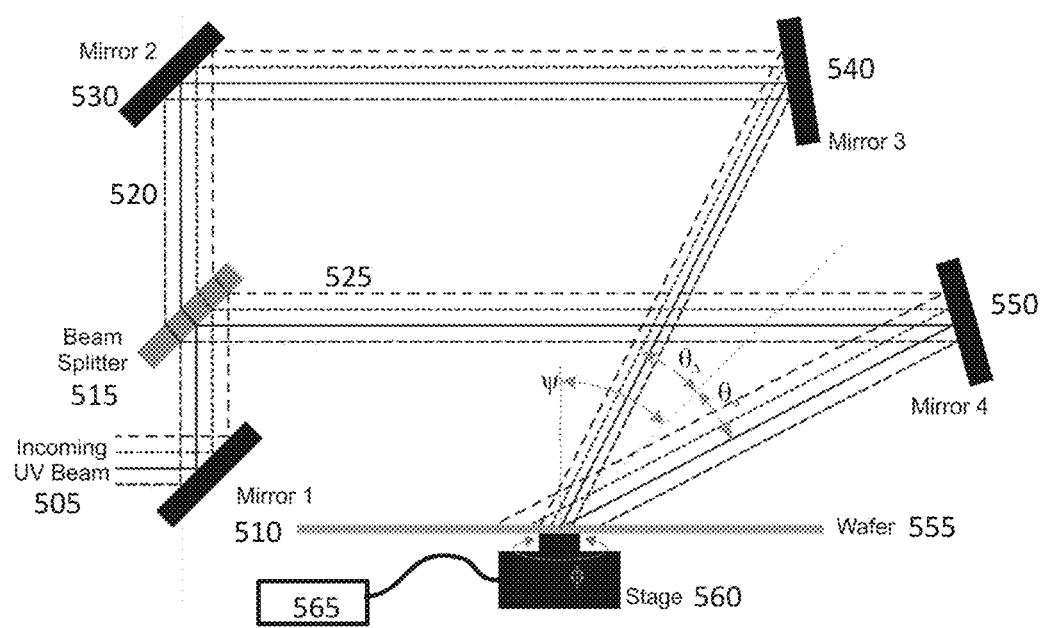
FIG. 5 shows another example illumination system comprising a Michelson interferometer in accordance with aspects of the present disclosure.

FIG. 5 shows another example illumination system comprising an interferometer, such as a Michelson interferometer, that can be used to provide the interfering beams for the two-beam exposures. The Michelson interferometer can use beamsplitter 515, such as a 50/50 beam splitter, to split an input beam 505, such as an UV beam, from one radiation sources (not shown) and directed by optical element 510, such as a mirror 1, into two beams 520 and 525, which can have equal intensity. The split two beams can include, e.g., reflected beam 525 and transmitted beam 520. Transmitted beam 520 can be directed to wafer 555 by optical element 530, such as mirror 2 and optical element 540, such as mirror 3. Reflected beam 525 can be directed onto wafer 555 supported on exposure stage (substrate table) 560 by optical element 550, such as mirror 4, and combined with radiation reflected from optical element 540. The optical elements of the illumination system can be arranged with respective mounts that can be actuated by a controller to effect a change in the path length of the radiation. Controller 565 can be connected to or coupled to stage 560 to adjust the stage 560 or wafer 555 in one or more degrees of freedom. For example, controller 565 can be operable to rotate the stage or wafer in direction about an axis perpendicular or substantially perpendicular to a top surface of the wafer or stage. By way of another example, controller 565 can be operable to tilt the stage or wafer in one or more degrees of freedom. In FIG. 5, both beams of the interferometer are tilted to the same side of the substrate normal, giving rise to tilted fringes in the photoresist layer as in FIG. 1.

Figure 6:
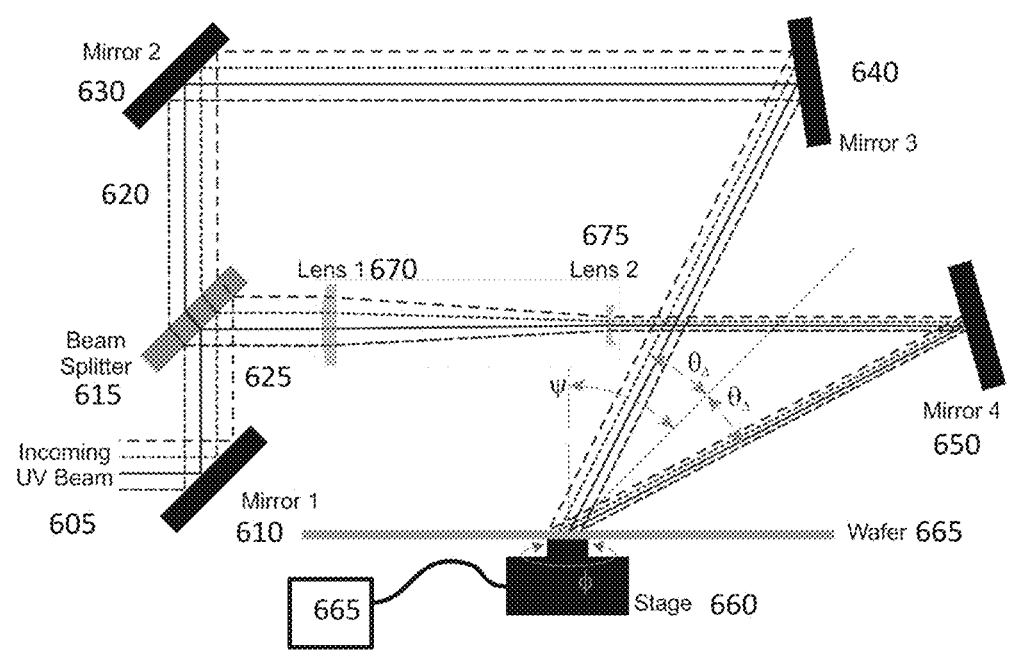
FIG. 6 shows another example illumination system comprising a Michelson interferometer in accordance with aspects of the present disclosure.

FIG. 6 shows another example illumination system comprising an interferometer, such as a Michelson interferometer, that can be used to provide the interfering beams for the two-beam exposures. The Michelson interferometer can use beamsplitter 615, such as a 50/50 beam splitter, to split an input beam 605, such as an UV beam, from one radiation sources (not shown) and directed by optical element 610, such as a mirror 1, into two beams 620 and 625, which can have equal intensity. The split two beams can include, e.g., reflected beam 625 and transmitted beam 620. Transmitted beam 620 can be directed to wafer 665 by optical element 630, such as mirror 2, and optical element 640, such as mirror 3. Reflected beam 625 can be directed onto wafer 655 supported on exposure stage (substrate table) 660 by a telescope arrangement, including optical element 670, such as lens 1, and optical element 675, such as lens 2, and optical element 650, such as mirror 4, and combined with radiation reflected from optical element 640. The optical elements of the illumination system can be arranged with respective mounts that can be actuated by a controller to effect a change in the path length of the radiation. Controller 665 can be connected to or coupled to stage 660 to adjust the stage 660 or wafer 655 in one or more degrees of freedom. For example, controller 665 can be operable to rotate the stage or wafer in direction about an axis perpendicular or substantially perpendicular to a top surface of the wafer or stage. By way of another example, controller 665 can be operable to tilt the stage or wafer in one or more degrees of freedom. The function of the telescope, lenses 670 and 675, is to allow overlap of the two beams to within the transverse coherence length of the source. Since the impact of the tilt is only in the plane of the figure, these are preferably cylindrical lenses.

Figure 7:
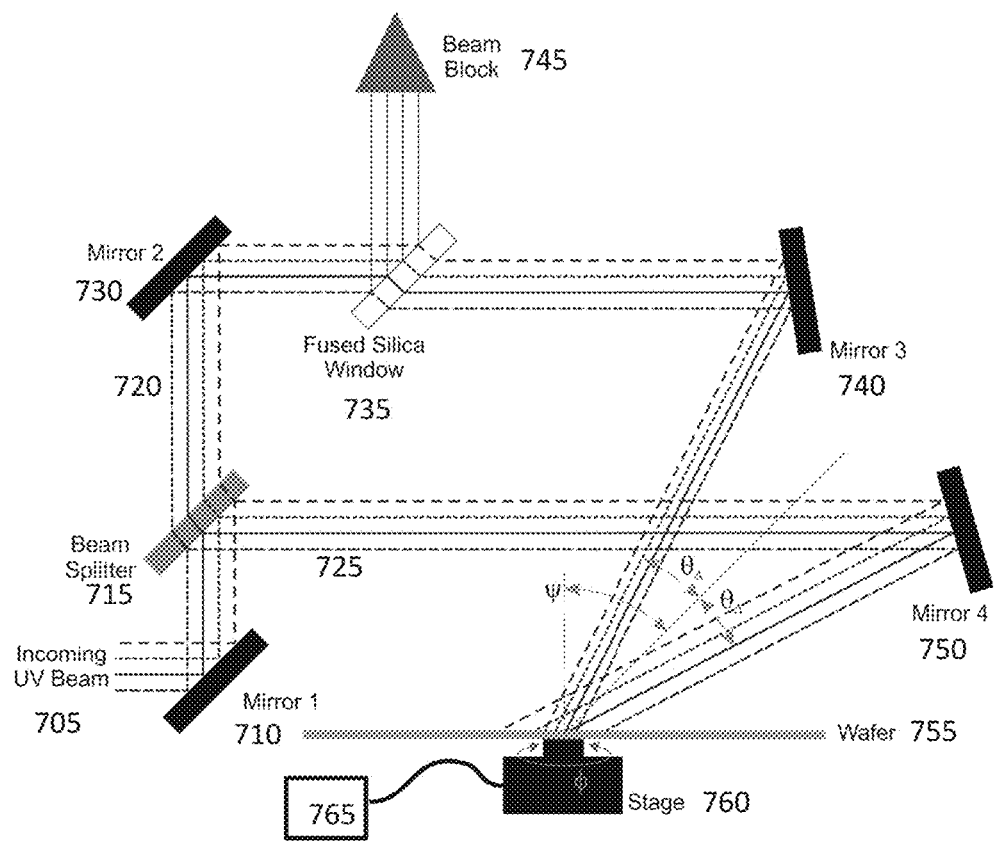
FIG. 7 shows another example illumination system comprising a Michelson interferometer in accordance with aspects of the present disclosure.

FIG. 7 shows another example illumination system comprising an interferometer, such as a Michelson interferometer, that can be used to provide the interfering beams for the two-beam exposures. The Michelson interferometer can use beamsplitter 715, such as a 50/50 beam splitter, to split an input beam 705, such as an UV beam, from one radiation sources (not shown) and directed by optical element 710, such as a mirror 1, into two beams 720 and 725, which can have equal intensity. The split two beams can include, e.g., reflected beam 725 and transmitted beam 720. Transmitted beam 720 can be directed to fused silica window 735 via optical element 730, such a mirror 2, where a portion of transmitted beam 720 is directed to beam block 745 and the remaining portion is directed to wafer 755 by optical element 740, such as mirror 3. Reflected beam 725 can be directed onto wafer 755 supported on exposure stage (substrate table) 760 by optical element 750, such as mirror 4, and combined with radiation reflected from optical element 740. The optical elements of the illumination system can be arranged with respective mounts that can be actuated by a controller to effect a change in the path length of the radiation. Controller 765 can be connected to or coupled to stage 760 to adjust the stage 760 or wafer 755 in one or more degrees of freedom. For example, controller 765 can be operable to rotate the stage or wafer in direction about an axis perpendicular or substantially perpendicular to a top surface of the wafer or stage. By way of another example, controller 765 can be operable to tilt the stage or wafer in one or more degrees of freedom.

Fused silica window 735 is operable as a variable attenuator to ensure that the intensities of beams incident on the photoresist of wafer 755 are substantially similar since it is important to have high contrast in the fringes of the interferometric exposures. Window 735 is operable to be rotated with an actuator (not shown) to change its reflectivity, which allows for matching the intensities of the beams incident on wafer 755. In some aspects, a variable attenuator can be used instead of window 735. Alternatively, a half wave plate that is operable to rotate the polarization of the incident radiation and a polarizer that is arranged to only transmit the polarization that is matched with the other beam can be used instead of window 735. Beam block 745 is operable to absorb the power reflected from window 735 to at least limit the amount of radiation that an operator of the illumination system may experience and to reduce the occurrence of stray light or flare inadvertently impinging on the photoresist layer. In some aspects, beam block 745 is not required for operation of the illumination system.

Figure 8:
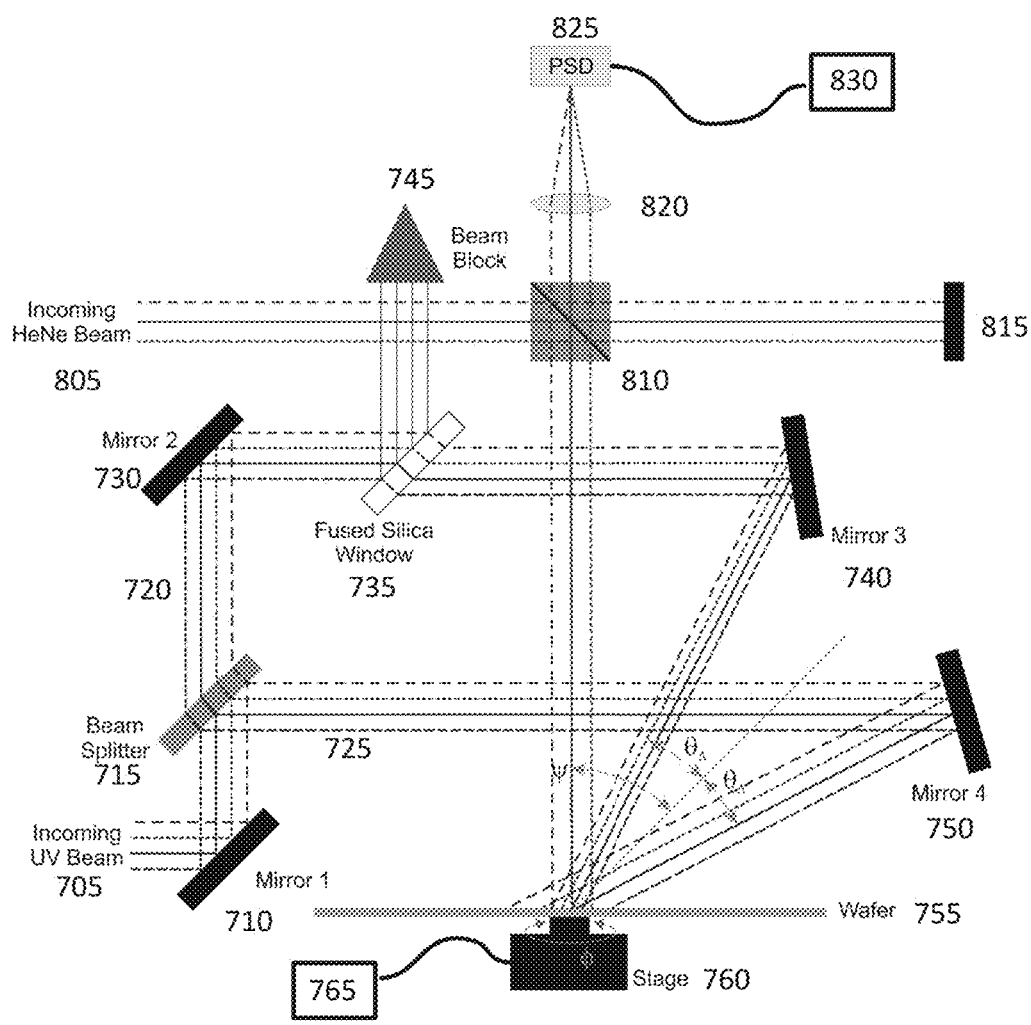
FIG. 8 shows another example illumination system comprising a Michelson interferometer with an alignment system in accordance with aspects of the present disclosure.

FIG. 8 shows another example illumination system comprising a Michelson interferometer with an alignment system in accordance with aspects of the present disclosure. FIG. 8 is similar to the arrangement shown in FIG. 7, with the addition of the alignment system, which can also be used in the arrangement shown in FIGS. 4-7 and 9, discussed below. The alignment system can be arranged in the form of a second Michelson interferometer and can include a secondary radiation source 805, such as a HeNe laser, beam splitter 810, mirror 815, converging lens 820, phase sensitive detection (PSD) system 825, and controller 830. The optical elements of the alignment system can be arranged in respective mounts that can be actuated by controller 830 to change the optical path of the radiation beam.

Figure 9:
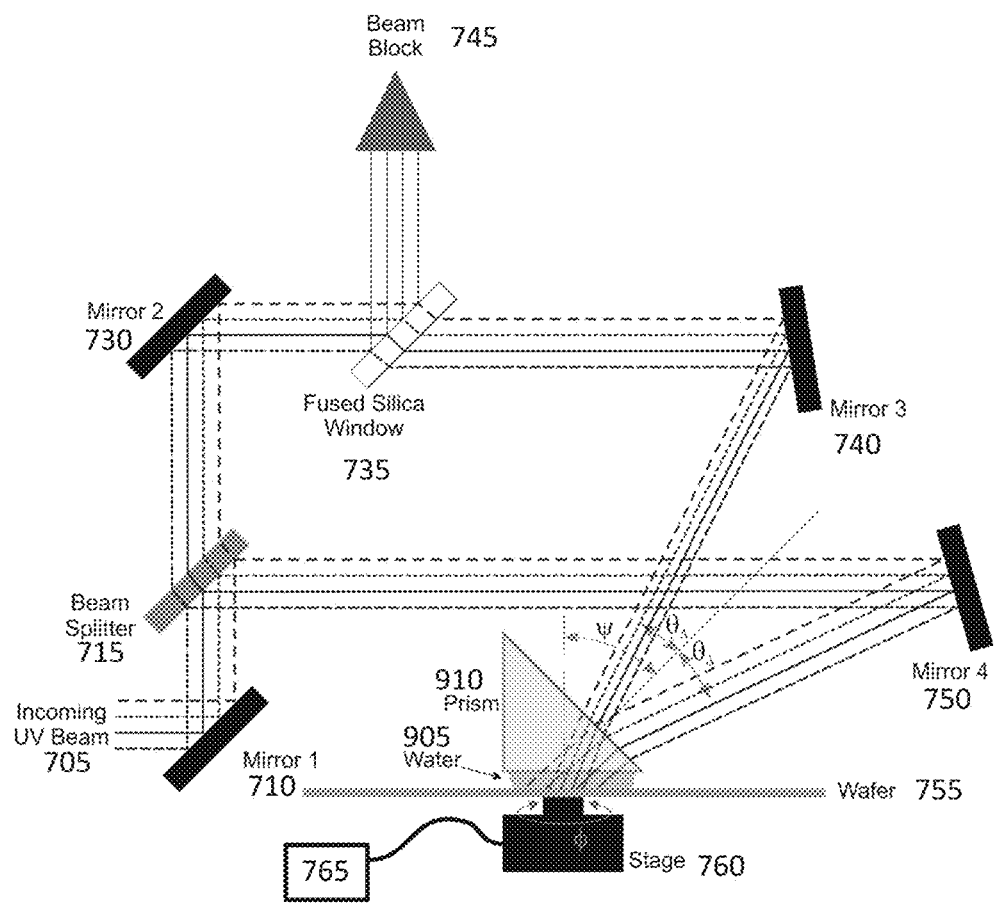
FIG. 9 shows another example illumination system comprising a Michelson interferometer in an immersion environment in accordance with aspects of the present disclosure.

FIG. 9 shows another example illumination system comprising a Michelson interferometer in an immersion environment in accordance with aspects of the present disclosure. FIG. 9 is similar to the arrangement shown in FIG. 7, with the addition of an immersion system. The immersion system can be used with the illumination system to increase the range of feature sizes which can be produced in the photoresist and specifically to permit the production of smaller features that correspond to propagation of the beams at steeper angles in the photoresist. The immersion system can be arranged in a variety of manners, as would be apparent. For example, an immersion fluid 905, such as water, can be provided to at least a portion of the wafer 755 by one or more fluid inlets coupled to the substrate table. The immersion fluid can be contained within a localized area below the final optical element of the illumination system and can be confined within that location by a confinement system, such a one or more barrier members including a gas barrier. The immersion fluid can be removed by one or more fluid outlets coupled to the substrate table. An optical element 910, such as a prism can be positioned near the portion of the wafer being imaged to receive radiation being directed toward the wafer and to allow for introduction of the interfering beams into the photoresist at steeper angles than are available without the immersion system.

In the examples illumination systems discussed above with respect to FIGS. 4-9, the intensities of the two beams can be different for a number of reasons including: 1) the beamsplitter 405, 515, 615, and 715 could have a splitting ratio that depends on the manufacture of the beamsplitter and might need some adjustment; 2) there are different optics in the two beam paths after the beamsplitter that might have different cumulative transmissions; 3) the beams are incident on the photoresist at different angles, so there are different Fresnel reflectivities from the photoresist surface; and 4) the beam sizes could be different because of the different angles of incidence, which could result in different intensities for the same power in each beam.

The optical elements, for example mirrors 1-4 can be arranged appropriately for the needed exposure angles and path lengths for both split beams provided by the beamsplitter. For example, beam splitter 405, 515, 615, and 715 and optical element 435, 540, 640, and 740 can be positioned left or right such that the path length of beam 1 is equal to the path length of beam 2. Having the same path length for both beams can maximize the interference pattern contrast and allow the maximum exposure area consistent with the laser coherence length. In embodiments, the input beam can be split in a manner that the two exposure beams can overlay each other with the same orientation, in other words, can match portions of the beams that split at the beam splitter and interfere with themselves at the exposure plane. In some cases, this can be essential for making large exposure areas if the light source, such as an excimer laser, has a small transverse coherence.

The optical configuration of FIGS. 4, 5, and 7 is appropriate for a source with a transverse coherence greater than the beam size, as in the case, for example, for a single transverse mode laser source. For the opposite case of a source with a transverse coherence much less than the beam size, as is the case, for example, for an excimer laser, it is necessary to provide additional, astigmatic telescopic optics to adjust the beam sizes of at least one arm of the illumination interferometer so that the interfering portions of the two beams are within the transverse coherence length of the source, as shown in FIG. 6.

In the example optical configurations of FIGS. 4-9, a sample can be arranged on a substrate (wafer) 440, 555, 655, and 755 and supported by substrate table (stage) 445, 560, 660, and 760. The sample can include a photoresist provided on a top surface of the sample that is responsive to the radiation provided by the illumination system.

In some aspects, the beamsplitters 405, 515, 615, and 715 of FIGS. 4-9 can be a phase-mask beamsplitter, phase-grating beamsplitter, and/or a plate beamsplitter. As would be apparent to those of ordinary skill in the art, the optical requirements of 1D and 2D interferometric lithography, when using a phase-mask beamsplitter, may need to be adjusted as needed.

Figure 10:
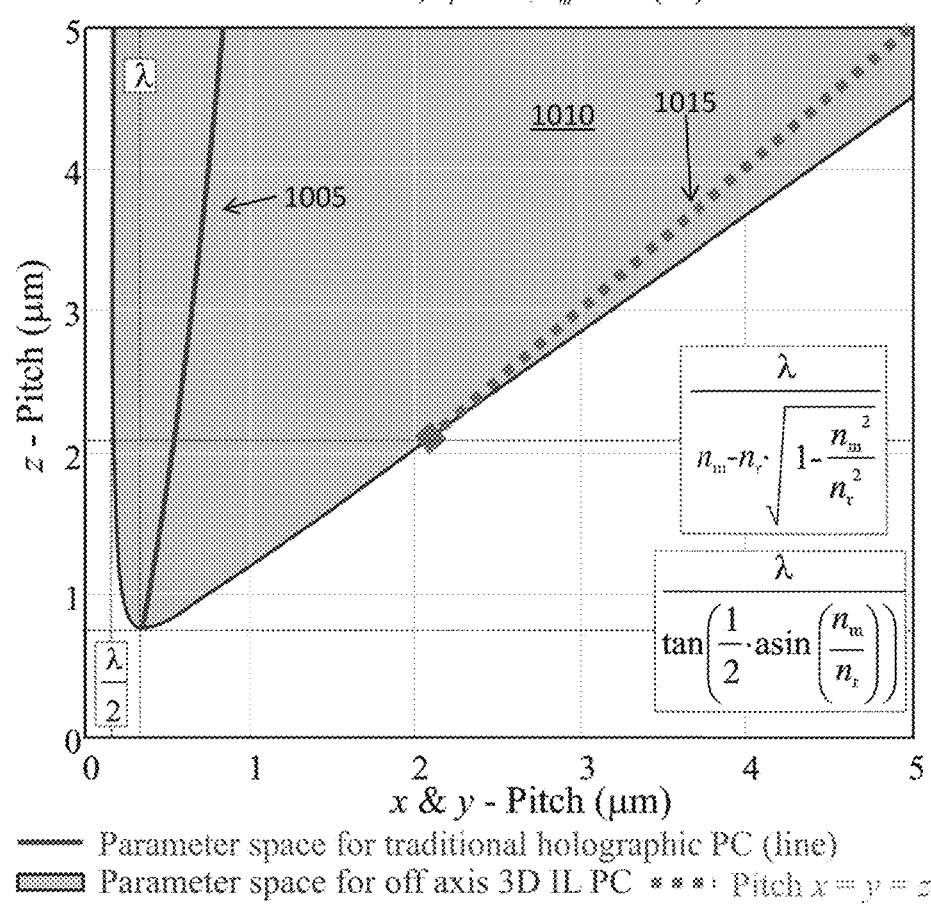
FIG. 10 shows example plot of available z-pitches versus available x (y) pitches for an exposure wavelength of $\lambda=355$ nm, photoresist index of refraction $n_r=1.3$, and an immersion medium index of 1.0.

To better understand the relation and parameter space for the z-pitch (period) compared to the transverse (e.g., lateral or x,y) pitches (periods), FIGS. 10-14 shows example plots of available z-pitches versus available x (y) pitches for various conditions, including various exposure wavelengths and indexes of refraction for the photoresist ($n_r$). FIG. 10 shows a plot for an exposure wavelength of $\lambda$=355 nm and photoresist index of refraction $n_r$=1.3, where the line 1005 represents the z-pitch versus x(y)-pitch for on-axis 3D IL PhCs, or in other words, represents the locus for the z-period versus the x(y)-period for on-axis single-exposure multi-beam 3D IL PhCs. Area 1010 represents the combinations of z-pitches and x-pitches achievable with off-axis multiple two-beam 3D IL PhCs, or in other words, represents the much greater range of combinations of z-periods versus x-periods achievable with off-axis multiple, two-beam exposure 3D IL PhCs. The dashed line 1015 represents the symmetrical PhC (z-pitch=x-pitch).

Figure 11:
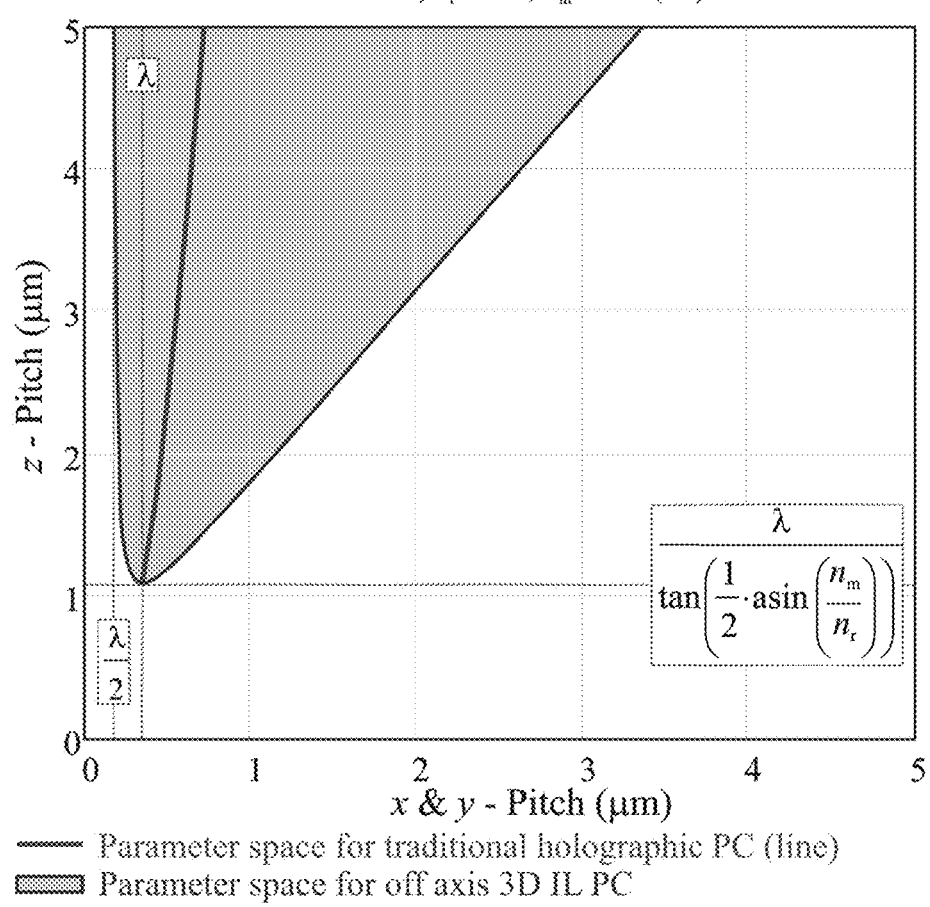
FIG. 11 shows an example plot of available z-pitches versus available x (y) pitches for an exposure wavelength of $\lambda=355$ nm, a photoresist index of refraction $n_r=1.7$, and an immersion medium index of 1.0.
Figure 12:
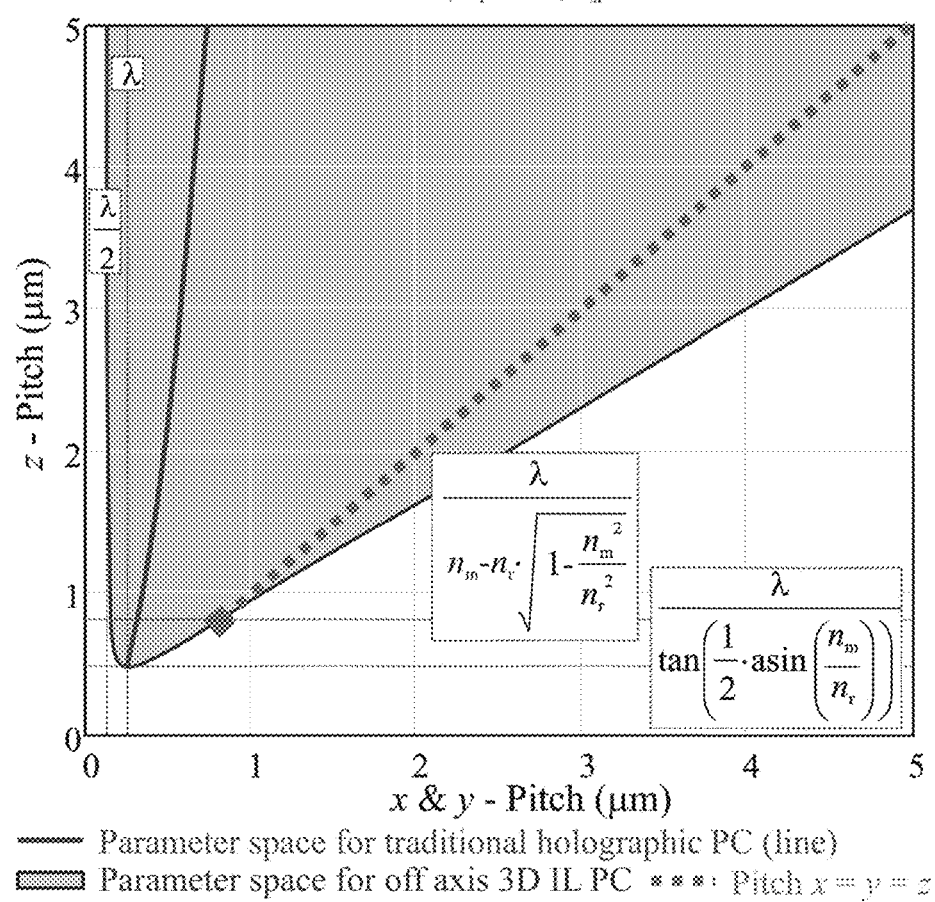
FIG. 12 shows example plot of available z-pitches versus available x (y) pitches for an exposure wavelength of $\lambda=355$ nm, a photoresist index of refraction $n_r=1.7$, and an immersion medium index of 1.4.
Figure 13:
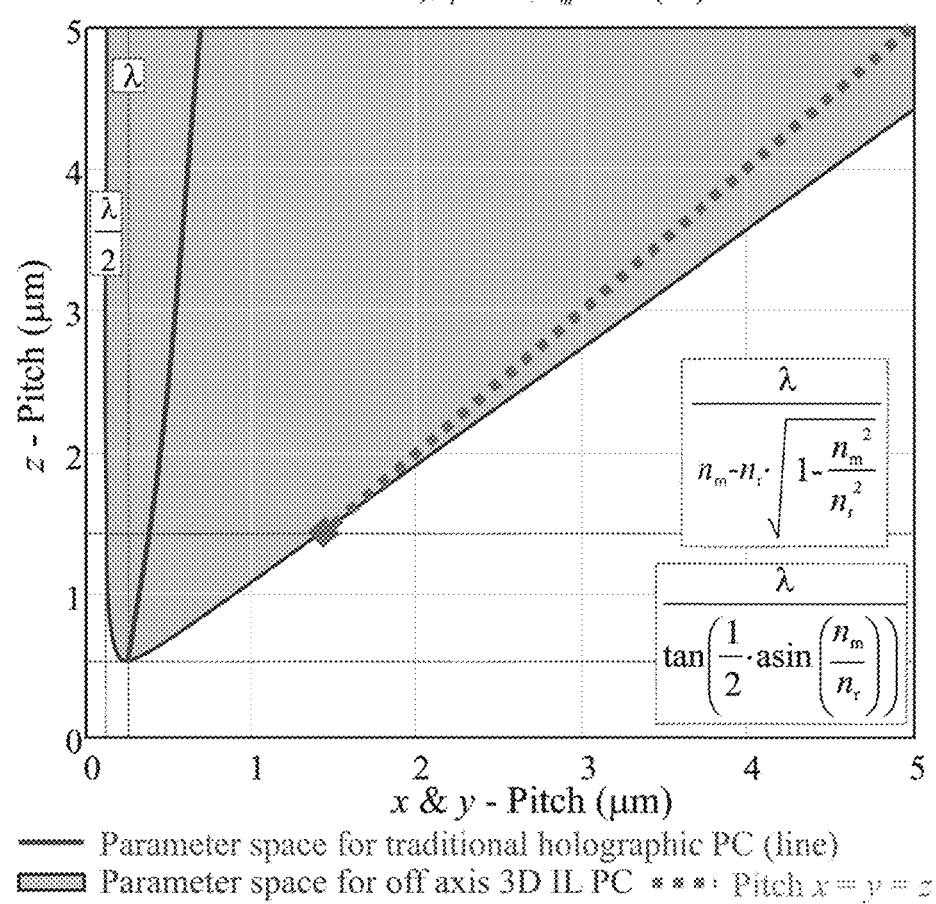
FIG. 13 shows example plot of available z-pitches versus available x (y) pitches for an exposure wavelength of $\lambda=248$ nm, a photoresist index of refraction $n_r=1.3$, and an immersion medium index of 1.0.
Figure 14:
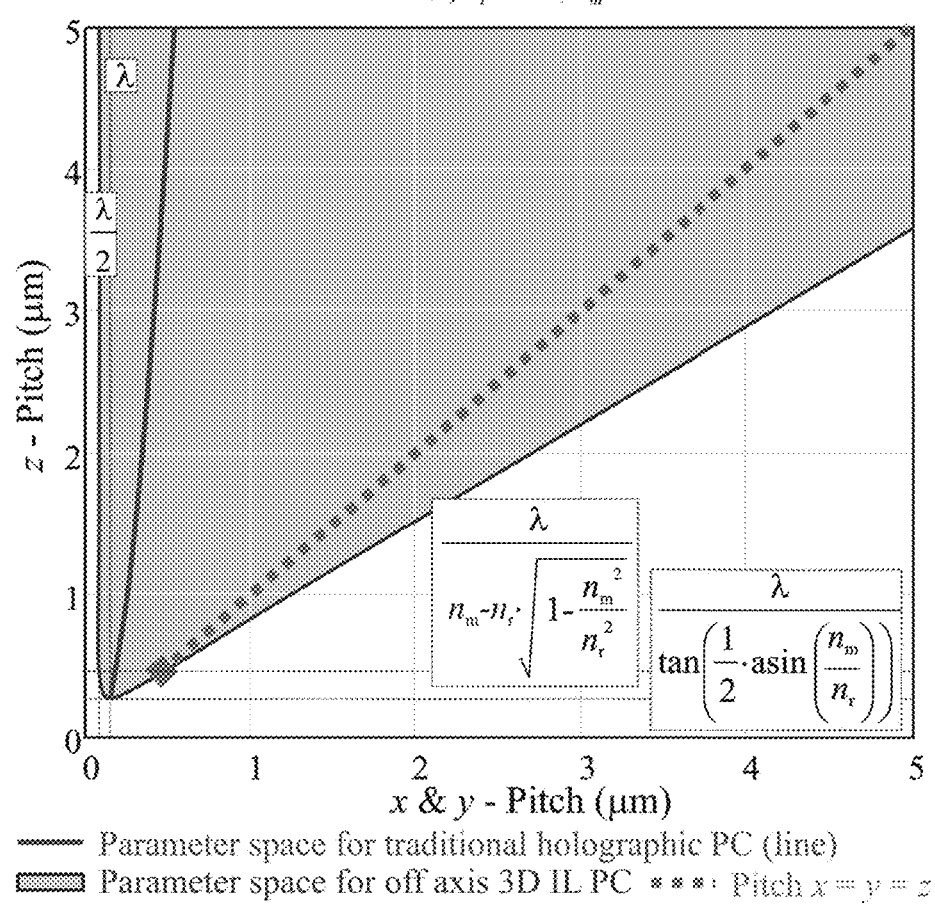
FIG. 14 shows example plot of available z-pitches versus available x (y) pitches for an exposure wavelength of $\lambda=193$ nm, a photoresist index of refraction $n_r=1.7$, and an immersion medium index of 1.4.

FIG. 11 shows an example plot of available z-pitches versus available (x-, y-) pitches for an exposure wavelength of $\lambda$=355 nm, a photoresist index of refraction $n_r$=1.7, more characteristic of currently available commercial resists, and an immersion medium refractive index, $n_m$=1.0 (e.g. air). The space of available pitches is smaller as a result of the bending of the interferometric beams on entering the higher index photoresist. FIG. 12 shows example plot of available z-pitches versus available (x-, y-) pitches for an exposure wavelength of $\lambda$=355 nm, a photoresist index of refraction $n_r$=1.7, and an immersion medium index of $n_m$=1.4. The higher index of the immersion medium, for example water, allows recovery of the larger space of available pitches as in FIG. 10. FIG. 13 shows example plot of available z-pitches versus available (x-, y-) pitches for an exposure wavelength of $\lambda$=248 nm, a photoresist index of refraction $n_r$=1.3, and an immersion medium refractive index of $n_m$=1.0. FIG. 14 shows example plot of available z-pitches versus available (x-, y-) pitches for an exposure wavelength of $\lambda$=193 nm, a photoresist index of refraction $n_r$=1.7, and an immersion medium index of $n_m$=1.4. As a result of the shorter wavelength, smaller features are possible in this configuration.

Figure 15:
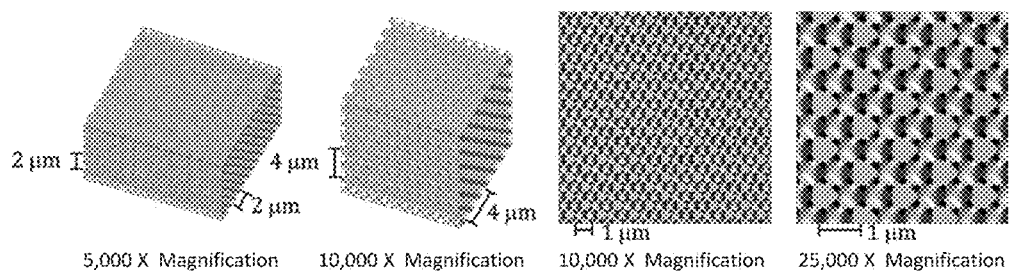
FIG. 15 shows a mathematical model for an exemplary 3D hexagonal IL PhC made using 3 exposures with 120° rotation in accordance with the disclosed multiple-exposure IL technique.

FIG. 15 depicts mathematical models for an exemplary 3D PhC made using the disclosed multiple, two-beam exposure IL technique. The first set of images focuses on the PhCs made using a three-exposure process (with 120° rotations of the sample) that creates 3D PhC with hexagonal symmetry.

Figure 16:
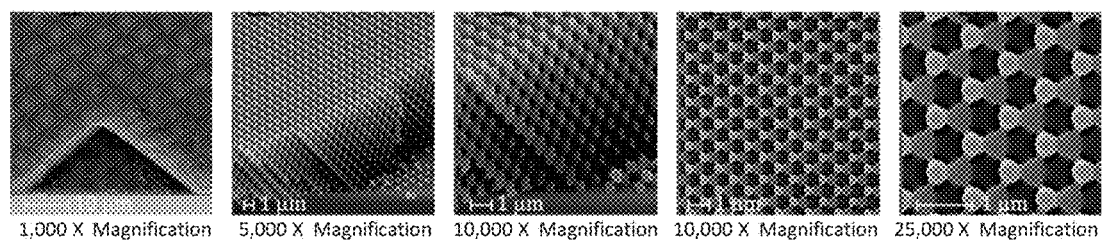
FIG. 16 shows results from experiments for exemplary cubic 3D IL PhC formed using 3 exposures with 120° rotation in accordance with various embodiments of the present teachings.

FIG. 16 depicts SEM images of exemplary 3D PhCs made using the disclosed multiple, two-beam exposure IL technique. This set of images shows PhCs made using a three-exposure process (with 120° rotations of the sample) that creates a 3D PhC with hexagonal symmetry. The experimental PhCs are made in Futurrex NR7-6000P negative photoresist at a thickness of 12 µm exposed at 355 nm using a frequency tripled Nd:YAG laser with a large transverse coherence length. These conditions apply to all of the examples presented herein.

In FIG. 16, the exemplary silicon wafer substrate is cleaved for cross-sectioning and the formed PhC on the surface is also cleaved along its crystal planes. As seen from the SEM images in FIG. 16, the PhC is uniform over the 10-µm$^2$ imaged area, while the overall size of the formed PhC is about 2 cm$^2$ by 12 µm thick. In embodiments, small variations from the surface to the bottom of the photonic crystal can be observed, which are significantly distinguished from the variation of the nodes due to the photonic crystal cleave angle. For example, variation in the photonic crystal hole size is likely due to variation in exposure dose versus photoresist depth from light absorption in the photoresist, and to a smaller extent from developer diffusion and concentration variations during the development process.

As observed, across the PhC area there can be phase shifts along the surface for every ~3-5 mm, which appear as faint fringes on the PhC to the naked eye. These phase shifts can be from variations of the exposure plane due to wafer flatness or tilt. The void sizes in the crystal structure vary slightly from edge to edge of the 2-cm$^2$ PhC mostly due to exposure variations. For the top-down SEM images in FIG. 16, three periods down into the crystal are visible. The top down SEM clearly shows the hexagonal symmetry.

Figure 17:
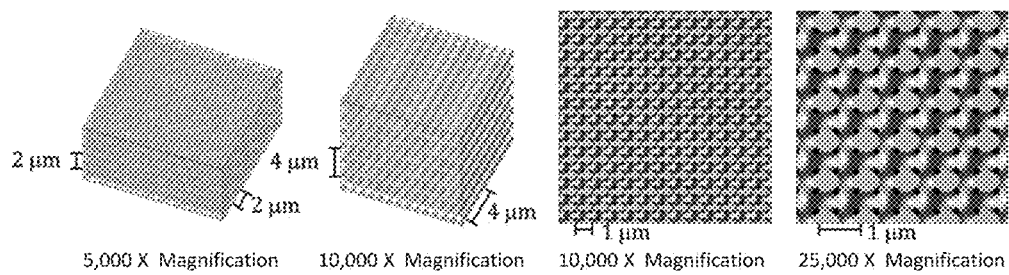
FIG. 17 shows results from a mathematical model for exemplary cubic 3D IL PhCs made using 4 exposures with 90° rotation in accordance with various embodiments of the present teachings.
Figure 18:
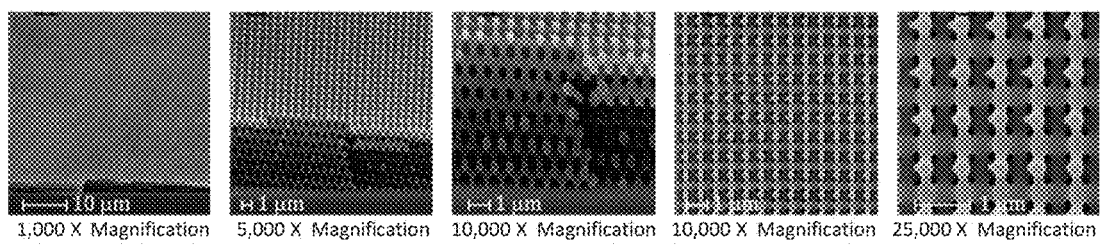
FIG. 18 shows results from experiments for exemplary cubic 3D IL PhCs made using 4 exposures with 90° rotation in accordance with various embodiments of the present teachings.

FIGS. 17 and 18 depict exemplary cubic 3D IL PhCs made using 4 exposures with 90° rotation in accordance with various embodiments of the present teachings. Specifically, FIG. 17 depicts results from the mathematical model, and FIG. 18 depicts results from experiments. The four-exposure 3D PhC fabrication of a rectangular structure shown in FIGS. 17 and 18 can be similar to the three-exposure process depicted in FIGS. 15 and 16. However, the additional exposure requires additional rotational and wafer tilt alignments.

In FIG. 18, the exemplary silicon wafer substrate is cleaved for cross-sectioning and the formed PhC on the surface is also cleaved along its crystal planes, which are slightly out of alignment with the silicon cleavage plane. The formed PhC can be uniform over the 10-µm$^2$ area imaged with an overall size of about 2 cm$^2$ by 12 µm. For the top-down SEM images in FIG. 18, four periods down into the crystal are visible. As mentioned above, the variation in the photonic crystal pore size is likely due to variation in exposure dose versus photoresist depth from light absorption in the photoresist, and to a smaller extent from developer diffusion and concentration fluctuations during developing. Also, across the PhC area there are phase shifts along the surface for every ~2-3 mm, and the void sizes in the crystal structure vary slightly from edge to edge. The top down SEM clearly shows an exemplary square symmetry.

Three-dimensional helical photonic crystals are attractive for chiral metamaterial devices that mix electrical and magnetic responses. In chiral metamaterials, the refractive index for propagation of light along the axis of the helix is different as the handedness of the circular polarization is parallel or antiparallel to the chiral axis. The refractive index is increased for one circular polarization and reduced for the other, if the chirality is strong enough, negative refraction may occur. In some aspects, a multiple exposure two-beam interferometric lithography (IL) technique utilizing six separate two-beam exposures for fabricating 3D helical photonic crystals may be used. In contrast to most previous demonstrations which used a two-photon direct-write process, IL is a large-area process readily adaptable to realistic manufacturing constraints. This novel interferometric lithography uses only TE polarized light for maximum contrast and allows for independent dimensional control of the helix pitch and periodicity along each lattice axis. Both mathematical models and experimentally realized three-dimensional helical photonic crystals (over an mm² in area and up to 5 μm tall, with a helix spacing of 890 nm on a hexagonal grid) are presented. The helical photonic crystals can be formed as a thick photoresist structure that can be subsequently used as a mandrel for a sol-gel or metal electroforming process, enabling a high index contrast chiral metamaterial.

In some aspects of the present disclosure, an exemplary technique is disclosed that can create dense arrays of helical structures (3D PhC) using a simple, parallel, large-area lithography process with the capability to regulate the size, shape and periodicities of the crystal, allowing independent control over the helical lattice periodicity and coil pitch of the 3D PhC. This technique consists of a simple two-beam off-axis Michelson interferometric lithography arrangement with multiple exposures followed by a single development step.

The helical pillar photoresist structures are prone to collapse during the drying step of the development process due to the surface tension applied to the high aspect ratio and small substrate contact area of the photoresist. The inverse structures, helical holes, can be obtained by lowering the exposure dose, and will not have any issues with pattern collapse. These inverse helical pillars can subsequently be used as a mandrel for a sol-gel or metal electroforming process, enabling a high index contrast chiral metamaterial. This initial demonstration concentrated on the helical pillars.

Figure 19:
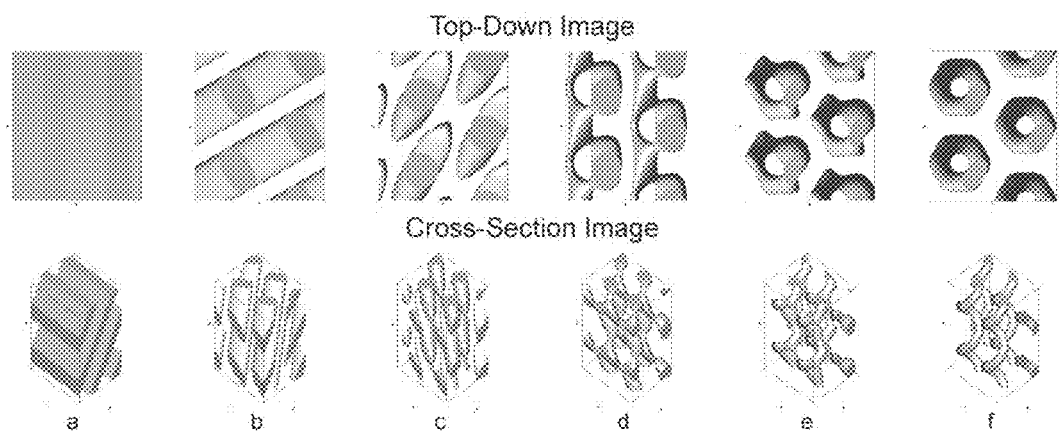
FIG. 19 shows exemplary steps for a six-exposure 3D helical IL PhC.

FIG. 19 shows the steps in the definition of a six-exposure 3D IL PhC that provides the helical structures. The first exposure results in a latent image of a one-dimensional grating with tilted lines in the photoresist. After a 60° rotation about the sample normal and a π/3 phase-shift in the z-direction the second exposure sums with the first to form a latent image of a 2D array of tilted posts in the photoresist. After additional 60° rotations, π/3 phase-shifts, and exposures of the sample, all of the exposures sum in the photoresist (each exposure is coherent; they sum incoherently) to form a latent image of a 3D helical PhC. The summed latent image after each exposure is shown in FIG. 19, depicting how each exposure is added together to achieve the final helical structure. The photoresist is then post-exposure baked and developed to result in the final 3D helical PhC. The phase-shift, rotation and tilt of the exposure stage between exposures needs to be tightly controlled in three-dimensional IL. The π/3 phase-shift in the z-plane between exposures is necessary to achieve the desired spiraling of the latent image to form the helical PhC. If the rotation or tilt is not set precisely, an undesirable phase variation will result along the exposure plane (essentially a moiré pattern). This will cause a phase shift of the helical pillars across the PhC. In the experiments, a HeNe laser interferometer was used to monitor and provide feedback control of the phase shift, tilt and rotation between exposures.

Both images created by mathematical models and by SEM images of the experimental 3D PhCs using the multiple-exposure IL setup are presented. The set of images were made using a six-exposure process (with 60° rotations and π/3 phase-shift in the z-plane between each exposure) that creates a 3D helical PhC. The experimental PhCs are made in Futurrex NR7-6000P negative photoresist at a thickness of 5 μm exposed at 355 nm.

Figure 21:
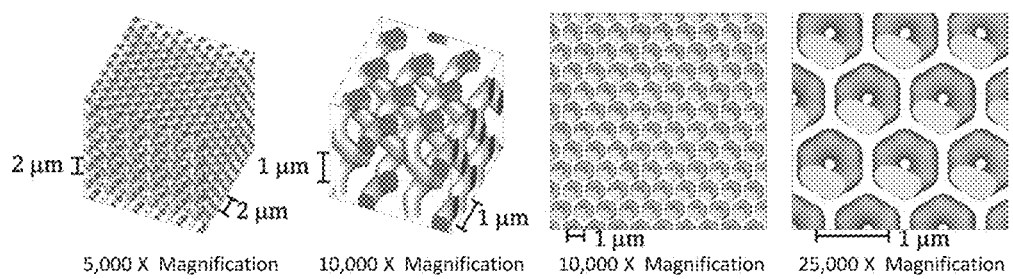
FIG. 21 shows a mathematical model for exemplary helical PhC made using 6 exposures with 60° rotations in accordance with various embodiments of the present teachings.
Figure 22:
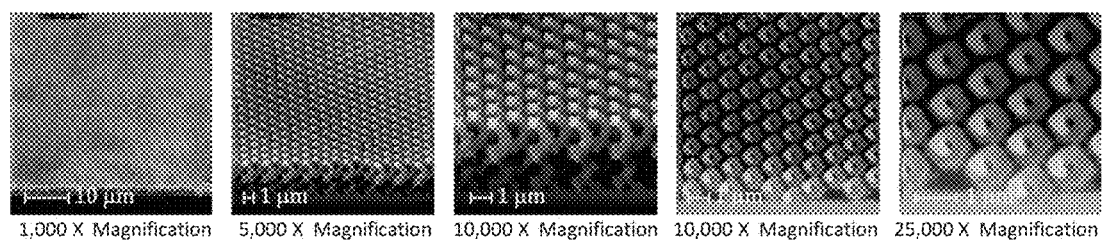
FIG. 22 shows results from experiments for exemplary helical PhC according various embodiments of the present teachings.

FIG. 21 shows close-up simulations of the helical PhC made by the 6-exposure off-axis interferometry lithography. The simulation model parameters were: $\psi=45°$, $\theta_A=8°$, $\phi=60°$, $N=6$, $n_r=1.7$, $\lambda=355$ nm, and Threshold=62%. The (x-,y-) pitch of these structures is 1.8 μm and the z-pitch is 4 μm. In FIG. 22, experimental SEM images are shown. The silicon wafer substrates of the experimental PhCs are cleaved for cross-section SEMs. The PhC is very uniform over the 10-μm² area imaged; the overall size of the PhC was ~2 cm² by 5 μm. Any variation in the photonic crystal coil size is likely due to variations in exposure dose versus photoresist depth resulting from light absorption in the photoresist, and to a smaller extent from developer diffusion and concentration fluctuations. The coil sizes in the crystal structure vary slightly from edge to edge of the 2-cm² PhC mostly due to exposure variations. For the top-down SEM images in FIG. 22, one full rotation of the crystal coils is visible. The top down SEM clearly shows the hexagonal symmetry of the helical crystals.

Figure 20:
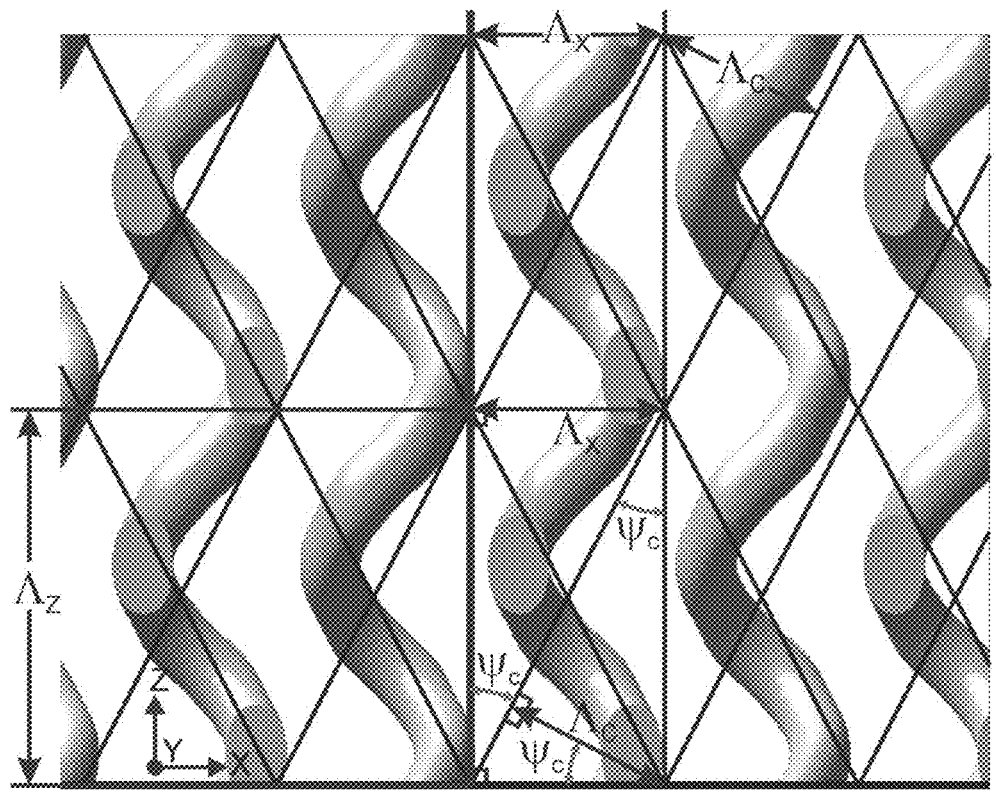
FIG. 20 shows cross-section of a 3D helical pattern and pitch definitions.

FIGS. 19-21 depict exemplary model results for helical (chiral) 3D IL PhCs made using 6 exposures with 60° rotation between two-beam exposures in accordance with various embodiments of the present teachings. FIG. 22 depicts results from experiments. The six-exposure 3D PhC fabrication of a helical structure shown in FIG. 19 can be similar to the three-exposure process depicted in FIGS. 15 and 17. However, additional exposure requires additional rotational and wafer tilt alignments. The optical properties of these helical symmetry structures have potential application in polarization manipulation and in negative-index materials. It is also necessary in these exposures to control the relative phases (absolute positions of the light and dark fringes at a fixed plane, e.g. the top surface of the photoresist). For each exposure, corresponding to a 60° azimuthal rotation, the phase is also adjusted by π/3. This was not necessary in the three exposure case, unless a specific phase of the PhC was desired; in this case the 0° and 180° exposures (and the other equivalent pairs—60° and 240°; 120° and 300°) are required to have this phase relationship.

In FIG. 22, the exemplary silicon wafer substrate is cleaved for cross-sectioning. The formed PhC can be uniform over at least the 10-μm² area imaged with an overall size of about 2 cm² by 12 μm thick. For the top-down SEM images in FIG. 22, four periods down into the crystal are visible. Across the PhC area there are phase shifts along the surface for every ~2-3 mm, and the helical size of the crystal structure varies slightly from edge to edge. The top down SEM clearly shows an exemplary hexagonal symmetry of the helical structures.

Waveguides can be fabricated, embedded within PhCs by using two different exposure wavelengths in separate exposures of the photoresist film. For example, the first wavelength can be used to create the latent image of the PhC as disclosed herein, and the second wavelength can be used to create the latent image of the waveguides within the PhCs. Both exposures can be in the same layer of photoresist material, which is disposed on a substrate. The exposures are then followed with a common post-exposure bake and development process In one embodiment, the waveguide is exposed, by standard lithography techniques, in a first photoresist layer using a wavelength that is strongly absorbed by the photoresist. After development, this exposure will result in a waveguide region confined to the near surface region of the photoresist and extending into the resist by approximately an absorption length at the exposing wavelength. In some aspects, a buried waveguide can be formed that can be, fully surrounded by the PhC by using a second layer of photoresist that can be spun on to the first layer of photoresist and post-application baked. These two layers of thick photoresist become the body of the PhC. Now the two layers of photoresist are exposed using the multiple, two-beam IL exposure technique at a wavelength for which the photoresist is very transparent to form the PhC. Following the exposures, the photoresist is post-exposure baked. Then the full two-layer photoresist stack is developed. The resulting photoresist pattern can be the functional sum of the two different wavelength exposures forming a PhC with embedded waveguides. The lateral size of the waveguide defect is a direct function of the waveguide mask pattern size and the waveguide exposure dose, and the thickness of the waveguide is a direct function of the photoresist absorption length at the waveguide exposure wavelength plus the waveguide exposure dose. For a surface waveguide, the second layer of photoresist is not used.

Figure 23:
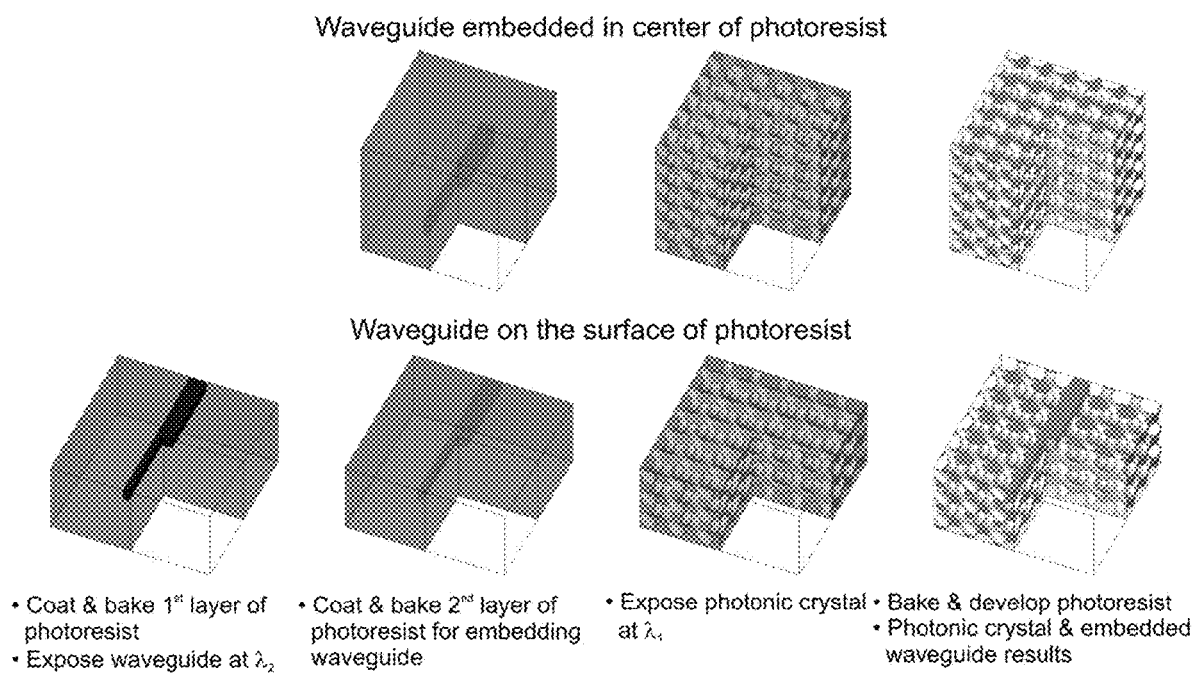
FIG. 23 shows various fabrication processes of waveguides embedded within photonic crystals in accordance with various embodiments of the present teachings.

FIG. 23 depicts various fabrication processes of waveguides embedded within photonic crystals in accordance with various embodiments of the present teachings. As shown, waveguides can be formed in any position within the later formed PhCs. For example, waveguides can be formed in the center of the two-layer-photoresist (or the formed PhCs), and/or be formed on the surface of the two-layer-photoresist (or the formed PhCs).

As disclosed herein, the photoresist can be selected to respond to exposure at both wavelengths for forming the waveguide and for forming the PhC. For example, many photoresists used in the semiconductor industry are sensitive to light over a large range of wavelengths. In one embodiment, a negative I-line photoresist used to make a PhC can be sensitive to a 244-nm light that is used to make the waveguide. Similarly a positive 248-nm photoresist used to make a PhC can be sensitive to a 193-nm-light that can be used to make the waveguide. In some embodiments, the photoresist can have the same tone for both wavelengths. In other embodiments, having the same photoresist tone at both wavelengths is not a requirement. For example, a photoresist usually acts as either a positive material or negative material at both wavelengths, but the process steps can be modified to produce similar results if the photoresist has a positive tone response at one wavelength and a negative tone at the other wavelength.

For PhC exposure, the selected photoresist can be transparent and have a highly nonlinear (thresholding) response curve at the PhC wavelength. As known, most photoresists are substantially transparent at their design wavelengths and exhibit a nonlinear response to the incident intensity during the exposure and development processes. For the waveguide exposure, the transparency of the photoresist at the exposing wavelength can play an important role. For example, if the photoresist is transparent at the waveguide exposure wavelength then the waveguide can extend through the full thickness of the photoresist. This can be desirable for two-dimensional PhCs, wherein the same wavelength can be used for both exposures. However if the photoresist is highly absorptive at the waveguide exposure wavelength, then the waveguide will exist on the surface of the crystal as shown in FIG. 23. By tailoring the absorption of the photoresist at the waveguide exposure wavelength, the waveguide thickness can be controlled.

In embodiments, the described techniques can be expanded to more than two layers of the photoresist. For example, a three-layer process can be used to fabricate a layer of embedded waveguides patterns that are ⅓ from the bottom of the PhC and a second layer of embedded waveguides patterns that are ⅔ from the bottom of the PhC. Using processing variations, vertical waveguides between the two embedded waveguide layers can be fabricated using a via exposure patterning step on the second photoresist layer. This via pattern exposure can be performed either by using a high dose at the waveguide exposure wavelength, or using a third exposure wavelength with lower photoresist absorption than the waveguide exposure wavelength. In this case, optical circuits can be integrated and fabricated into the PhC.

Figure 24:
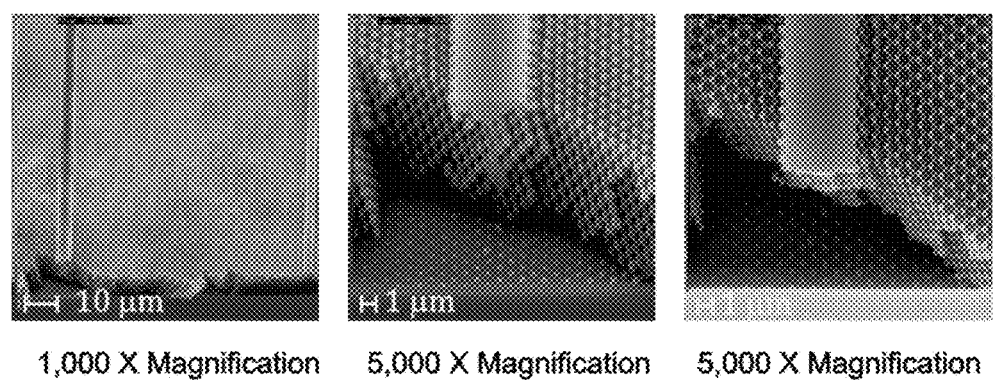
FIG. 24 shows results from experiments for a single layer 355 nm three-exposure 3D PhCs with a 244 nm surface waveguides exposure in negative photoresist.
Figure 25:
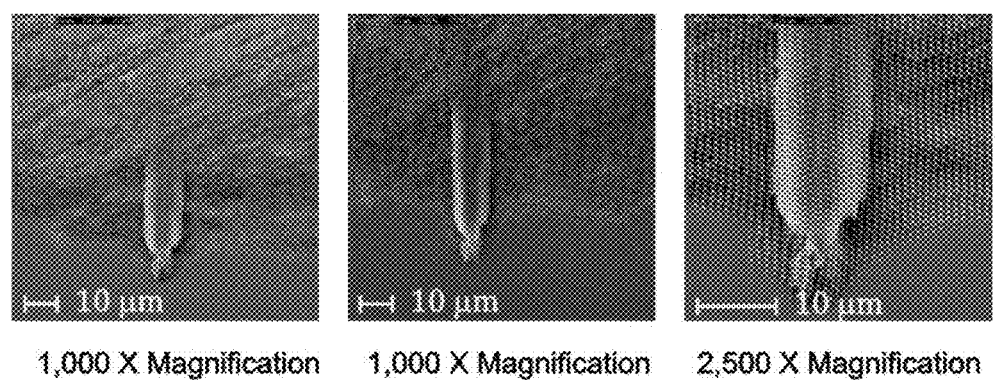
FIG. 25 depicts results from experiments for a dual layer 355 nm three-exposure 3D PhC with an embedded 244 nm waveguide exposure in negative photoresist that after fabrication was subjected to a chemical etch-back process in order to reveal the individual layers of the PhC and the embedded waveguide.

In an exemplary embodiment, 3D PhCs with waveguides can be fabricated in negative tone photoresist, using a three- and a four-exposure IL process. FIG. 24 depicts SEM results for a single layer 355 nm three-exposure 3D PhCs with a 244 nm surface waveguides exposure in Futurrex NR7-6000P negative photoresist. Waveguides formed on the surface of the PhCs can be seen more easily in the SEM than waveguide formed in the center of the PhC. FIG. 25 depicts SEM results for a dual layer 355 nm three-exposure 3D PhC with an embedded 244 nm waveguide exposure in Futurrex NR7-600P negative photoresist that after fabrication was subjected to a chemical etch-back process in order to reveal the individual layers of the PhC and the embedded waveguide. In most cases, the embedded waveguides appear as a missing void in the cleaved section of the PhC in cross-section SEM images. These are not visible in the top-down SEM images.

In this manner, a 3D PhC can be fabricated based on multiple-exposure, two-beam IL with off axis illumination. The disclosed IL techniques can be used to produce PhCs over large areas, as indicated by both modeled and experimental photoresist profiles of 3D PhCs. In embodiments, 3D PhCs can be made of high quality over large two square centimeter areas by IL. In addition to the large 3D photonic crystals, waveguides can be integrated into the PhCs in the fabrication process and in the final structures using the disclosed multiple-wavelength lithography technique, wherein a first wavelength is used to create the PhC using IL and a second wavelength is used to create the waveguide using standard lithography. As disclosed herein, waveguides integrated with 3D PhCs can provide other devices including but not limited to narrow-band filters; waveguide bends, splitters, and resonators; channel-drop filters; and coupled-cavity waveguides.

One limitation of the present experimental crystals can be that the PhCs lack a full photonic band-gap as a result of the low index contrast between the photoresist and air. A larger index contrast is required for the PhCs to exhibit a full band-gap. This can be achieved by using the photoresist PhC as scaffolding for a higher index material. One such method is an inverse-opal technique where a liquid sol-gel is introduced into the voids of the PhC and solidified during a curing step. A second method is to fill the voids of the PhC with a metal using an electroforming process in a plating bath. Both of these cases can create an inverse of the original PhC. The subsequent photoresist scaffolding can then be removed using $O_2$ plasma or some other chemical processes. Additionally, preprocessing can be done before the infiltration step; one example is pyrolysis to oxidize the photoresist, leaving an amorphous carbon film with dramatically reduced dimensions of the interconnects, but the same x,y dimensions of the nodes as a result of the adhesion to the substrate.

Optical properties of PhCs also can be controlled by modifying the developed photoresist structure. Such modification can include, e.g., incorporation of nanoparticles onto the surface of the photoresist structure, chemically altering the photoresist compound through the use of chemically reactive gases or liquids, and/or a post process that modifies the optical properties of the photoresist compound.

Another limitation can be that the demonstrated PhCs do not have full symmetry in the x, y, and z directions. In the present exemplary cases, full crystal symmetry is not achieved because the z-dimension is not scaled down sufficiently as a result of the high index of the photoresist (e.g., n~1.7) and the resulting Snell's law limitations on angle of propagation from the normal as the incident beams enter the photoresist. To further scale 3D PhCs using the multiple-exposure two-beam IL to smaller sizes and thus shorter band-gap wavelengths, the angles of the beams can be made larger. The larger the angle between the two beams the smaller the pitch of the crystal in the x and y directions. Likewise the larger the angle of the intercept of the two beams from normal of the exposure plane, the smaller the pitch in the z direction, although there is a limit associated with the Fresnel bending of the input beams at the air/photoresist interface. However, this can be addressed by using one or more of: immersion techniques (to reduce the Fresnel effects by lowering the index contrast on entering the resist); shorter actinic wavelengths; or lower index photoresists.

In embodiments, the fabrication process for the two-wavelength approach can include disposing an anti-reflective coating (ARC) between the photoresist and the substrate. This ARC is used to minimize the reflection of the exposure light off of the substrate. The ARC can either be a dielectric layer or a spun-on organic layer. Then a thick photoresist layer can be formed, e.g., spun atop the ARC. The photoresist is then baked to drive out solvents and to crosslink the photoresist.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. $-1$, $-2$, $-3$, $-10$, $-20$, $-30$, etc.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating an embedded waveguide integrated with a photonic crystal (PhC) comprising:
   providing a first photoresist layer on a substrate;
   proving first optical irradiation to form a latent image of a waveguide by exposing a surface of the first photoresist layer using a first wavelength, wherein an absorption depth and an exposure dose of the first wavelength is used to set a thickness of the waveguide;
   forming a second photoresist layer on the first photoresist layer containing the previously exposed latent image of the waveguide;
   providing second optical irradiation to form a latent image of a photonic crystal throughout a bulk of the first photoresist layer and the second photoresist layer by exposing both the first photoresist layer and the second photoresist layer at a second wavelength, wherein the first photoresist layer and the second photoresist layer are substantially transparent at the second wavelength;
   developing both the first photoresist layer and the second photoresist layer to create the waveguide and the photonic crystal after exposures have been made; and
   modifying photoresist structures that are developed to enhance a refractive index contrast by using sol-gel infiltration, pyrolysis, deposition and plating of metals and dielectrics.

2. The method in accordance with claim 1, further comprising providing three or more layers of photoresist and providing two or more independent waveguide exposures respectfully.

3. The method of claim 1, further comprising providing, by an immersion system, an optically homogeneous immersion fluid to an exposure region between a final optical element of an illumination system and both the first photoresist layer and the second photoresist layer along with an optical system to expand a range of accessible tilt angles of radiation in both the first photoresist layer and the second photoresist layer beyond those available without the immersion fluid.

4. The method of claim 1, wherein the second optical irradiation comprises multiple two-beam interferometric exposures wherein the substrate is moved in one or more degrees of freedom with respect to an illumination system between each two-beam interferometric exposure.

5. The method of claim 4, further comprising measuring and controlling a position of the substrate with respect to the illumination system in six rigid body degrees of freedom by a measurement and actuation system.

6. The method of claim 4, wherein the one or more degrees of freedom comprises rotation of a substrate normal, a tilt about two in-plane coordinates, or both rotation and tilts of a substrate table.

7. A method of fabricating an embedded waveguide integrated with a photonic crystal (PhC) comprising:
   providing first irradiation to form a latent image of a waveguide by exposing a surface of a first photoresist layer on a substrate using a first wavelength, wherein an absorption depth and an exposure dose of the first wavelength is used to set a thickness of the waveguide;
   forming a second photoresist layer on the first photoresist layer containing the previously exposed latent image of the waveguide;
   providing, by an immersion system, an optically homogeneous immersion fluid to an exposure region between a final optical element of an illumination system and the first photoresist layer and a second photoresist layer along with an optical system to expand a range of accessible tilt angles in the first photoresist layer and the second photoresist layer beyond those available without the immersion fluid;
   providing second irradiation to form a latent image of a photonic crystal throughout a bulk of the first photoresist layer and the second photoresist layer by exposing both the first photoresist layer and the second photoresist layer at a second wavelength, wherein the first photoresist layer and the second photoresist layer are substantially transparent at the second wavelength;
   developing both the first photoresist layer and the second photoresist layer to create the waveguide and the photonic crystal after exposures have been made; and
   modifying photoresist structures that are developed to enhance a refractive index contrast by using sol-gel infiltration, pyrolysis, deposition and plating of metals and dielectrics.

8. The method of claim 7, further comprising providing three or more layers of photoresist and providing two or more independent waveguide exposures respectively.

9. The method of claim 7, wherein the second optical radiation comprises multiple two-beam interferometric exposures wherein the substrate is moved in one or more degrees of freedom with respect to an illumination system between each two-beam interferometric exposure.

10. The method of claim 9, wherein the one or more degrees of freedom comprises rotation of a substrate normal, a tilt about two in-plane coordinates, or both rotation and tilts of a substrate table.

11. The method of claim 7, further comprising measuring and controlling a position of the substrate in six rigid body degrees of freedom by a measurement and actuation system.

12. A method of fabricating an embedded waveguide integrated with a photonic crystal (PhC) comprising:
providing first optical UV radiation to form a latent image of a waveguide by exposing a surface of a first photoresist layer on a substrate using a first wavelength, wherein an absorption depth and an exposure dose of the first wavelength is used to set a thickness of the waveguide;
forming a second photoresist layer on the first photoresist layer containing the previously exposed waveguide;
providing second optical UV radiation to form a latent image of a photonic crystal throughout a bulk of the first photoresist layer and the second photoresist layer by exposing the two layers of photoresist at a second wavelength, wherein the first photoresist layer and the second photoresist layer are substantially transparent at the second wavelength;
developing both the first photoresist layer and the second photoresist layer to create the waveguide and the photonic crystal after the exposures have been made; and
modifying photoresist structures that are developed to enhance a refractive index contrast by using sol-gel infiltration, pyrolysis, deposition and plating of metals and dielectrics.

13. The method of claim 12, further comprising providing three or more layers of photoresist and providing two or more independent waveguide exposures respectfully.

14. The method of claim 12, wherein the second optical UV radiation comprises multiple two-beam interferometric exposures wherein the substrate is moved in one or more degrees of freedom with respect to an illumination system between each two-beam interferometric exposure.

15. The method of claim 12, further comprising measuring and controlling a position of the substrate in six rigid body degrees of freedom by a measurement and actuation system.

16. The method of claim 12, further comprising moving the substrate in one or more degrees of freedom with respect to an illumination system using one or more actuators, wherein the one or more degrees of freedom comprises rotation of a substrate normal, a tilt about two in-plane coordinates, or both rotation and tilts of a substrate table.

17. The method of claim 12, further comprising providing, by an immersion system, an optically homogeneous immersion fluid to an exposure region between a final optical element of the illumination system and the first photoresist layer along with an optical system to expand the range of accessible tilt angles in both the first photoresist layer and the second photoresist layer beyond those available without the immersion fluid.

* * * * *